United States Patent
Moon et al.

(10) Patent No.: US 10,566,344 B2
(45) Date of Patent: Feb. 18, 2020

(54) METHOD OF MANUFACTURING SEMICONDUCTOR DEVICE USING EXPOSURE MASK HAVING LIGHT TRANSMISSION HOLES TO TRANSFER SLIT SHAPED PATTERN TO STACK STRUCTURE

(71) Applicant: SK hynix Inc., Gyeonggi-do (KR)

(72) Inventors: Woo Sung Moon, Gyeonggi-do (KR); Do Youn Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/983,726

(22) Filed: May 18, 2018

(65) Prior Publication Data
US 2019/0115359 A1   Apr. 18, 2019

(30) Foreign Application Priority Data
Oct. 17, 2017   (KR) .................. 10-2017-0134728

(51) Int. Cl.
| | |
|---|---|
| *H01L 21/02* | (2006.01) |
| *H01L 27/11582* | (2017.01) |
| *H01L 21/311* | (2006.01) |
| *H01L 27/11565* | (2017.01) |
| *H01L 21/027* | (2006.01) |
| *H01L 21/475* | (2006.01) |
| *H01L 21/768* | (2006.01) |

(52) U.S. Cl.
CPC .... *H01L 27/11582* (2013.01); *H01L 21/0274* (2013.01); *H01L 21/31116* (2013.01); *H01L 21/31144* (2013.01); *H01L 21/475* (2013.01); *H01L 21/76805* (2013.01); *H01L 27/11565* (2013.01)

(58) Field of Classification Search
CPC ............. H01L 21/0274; H01L 21/3083; H01L 21/3085; H01L 21/467; H01L 21/47; H01L 21/475; H01L 21/76805; H01L 27/11565; H01L 27/11582
See application file for complete search history.

(56) References Cited

U.S. PATENT DOCUMENTS

| | | | | |
|---|---|---|---|---|
| 9,627,396 | B2 * | 4/2017 | Son ................... | H01L 27/11524 |
| 9,721,663 | B1 * | 8/2017 | Ogawa ............... | G11C 16/0483 |
| 9,972,640 | B1 * | 5/2018 | Kai .................... | H01L 27/11519 |
| 2007/0278694 | A1 * | 12/2007 | Kobayashi ........ | H01L 21/76816 257/774 |
| 2012/0273965 | A1 * | 11/2012 | Seo ................... | H01L 27/11565 257/774 |
| 2018/0033639 | A1 * | 2/2018 | Jung ................ | H01L 21/30655 |

FOREIGN PATENT DOCUMENTS

| | | |
|---|---|---|
| KR | 1020150138934 | 12/2015 |
| KR | 101689770 | 12/2016 |

* cited by examiner

*Primary Examiner* — Stephen W Smoot
(74) *Attorney, Agent, or Firm* — IP & T Group LLP

(57) ABSTRACT

A method of manufacturing a three-dimensional semiconductor device, the method comprising: forming a stack structure; patterning channel holes using light transmission holes of an exposure mask; forming cell plugs penetrating the stack structure; and patterning wave-type slits using light transmission holes of the exposure mask, wherein the step of patterning holes further includes sequentially stacking a first mask layer and a first photoresist layer on the stack structure, and exposing the first photoresist layer by light transmitted through the exposure mask.

20 Claims, 22 Drawing Sheets

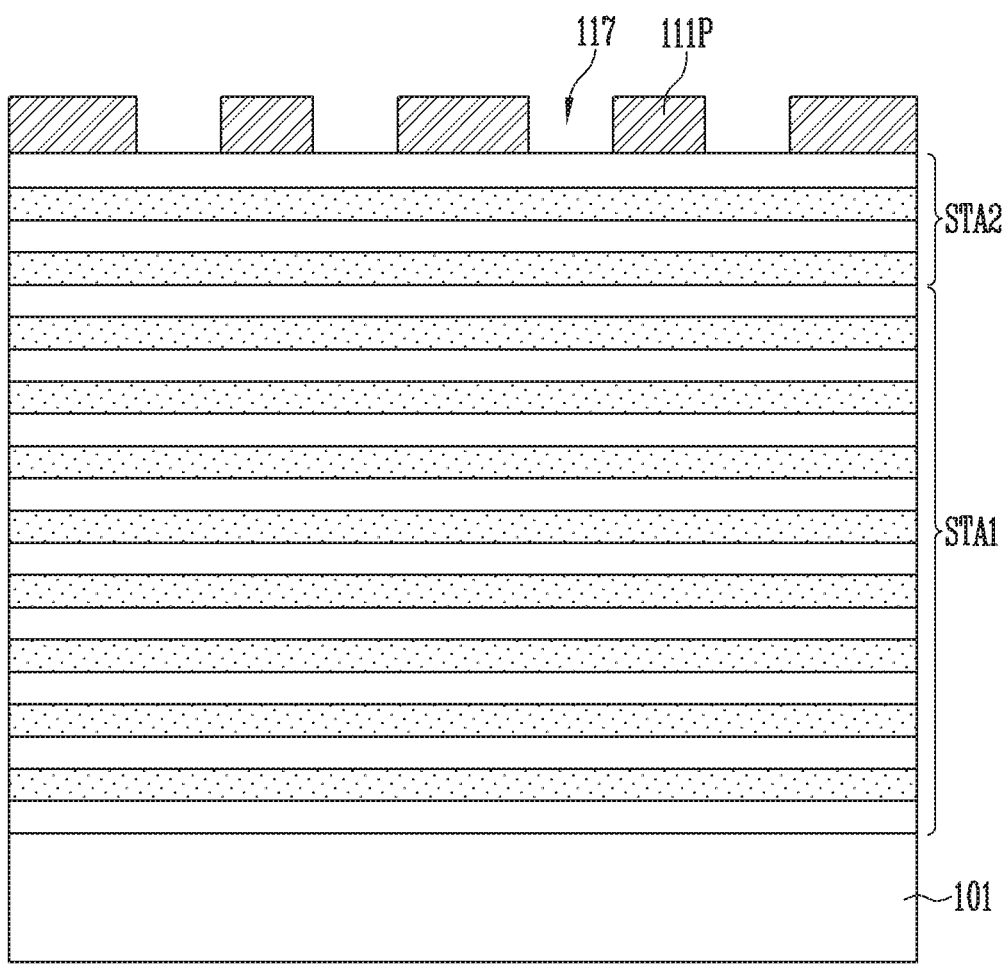

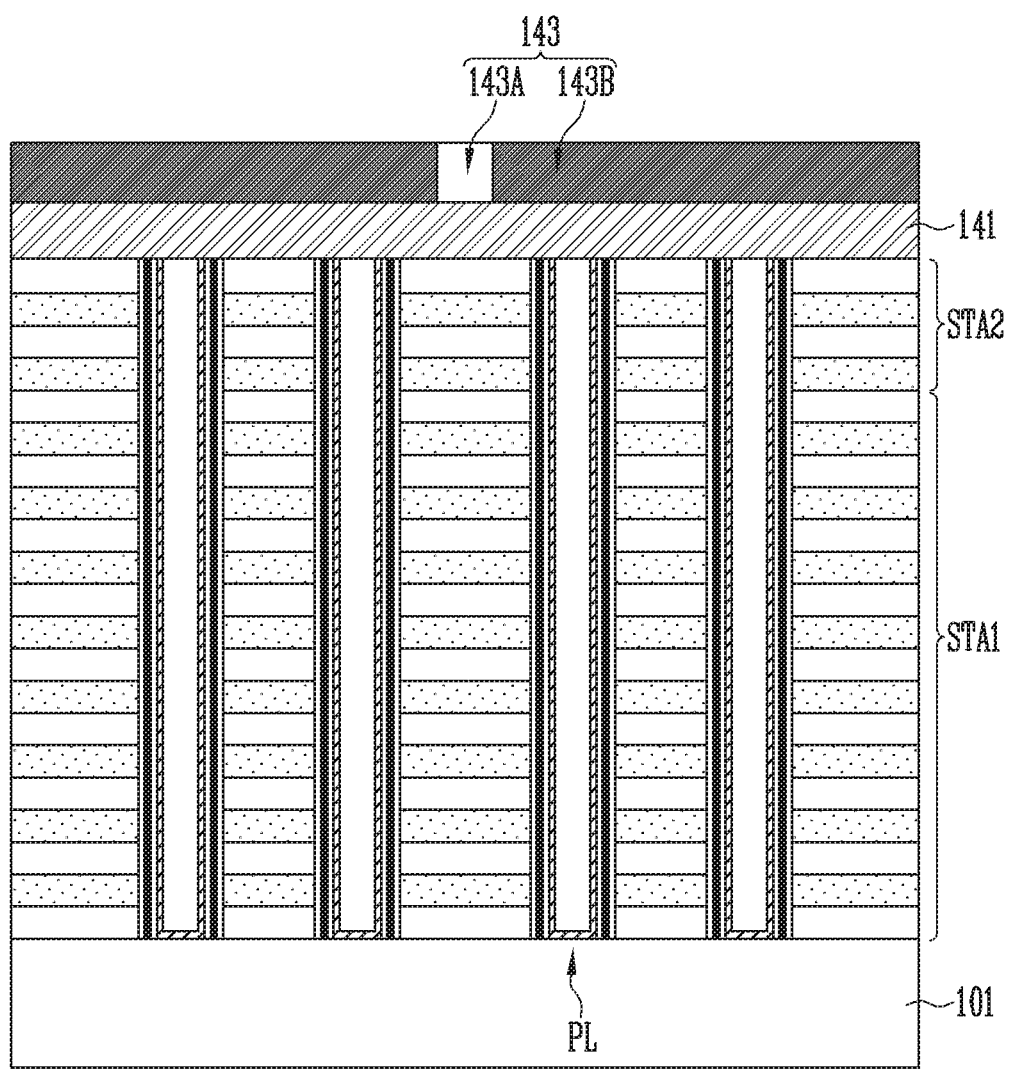

METHOD OF MANUFACTURING SEMICONDUCTOR DEVICE USING EXPOSURE MASK HAVING LIGHT TRANSMISSION HOLES TO TRANSFER SLIT SHAPED PATTERN TO STACK STRUCTURE

CROSS-REFERENCE TO RELATED APPLICATION

The present application claims priority under 35 U.S.C. § 119(a) to Korean Patent Application No. 10-2017-0134728, filed on Oct. 17, 2017, which is incorporated herein by reference in its entirety.

BACKGROUND

1. Field of Invention

An aspect of the present disclosure relates generally to a manufacturing method of a semiconductor device.

2. Description of the Related Art

A semiconductor device may include a memory cell array including a plurality of memory cells. The memory cell array may include memory cells arranged in various structures. In order to improve a degree of integration of the semiconductor device, the memory cells may be three-dimensionally arranged.

SUMMARY

According to an aspect of the present disclosure, there is provided a method of manufacturing a semiconductor device, the method including: forming a stack structure; forming a photoresist layer on the stack structure; exposing the photoresist layer with an amount of light controlled such that a first gap is transferred and second gaps are not transferred, using an exposure mask, wherein the exposure mask includes first light transmission holes, second light transmission holes, and a light blocking pattern, and is formed such that the light blocking pattern blocks the first gap between the first and second light transmission holes adjacent to each other and the second gaps between the first light transmission holes and between the second light transmission holes; forming a photoresist pattern by removing a non-exposure region of the photoresist layer, which corresponds to a transferred shape of the first gap; and forming a wave-type slit corresponding to the transferred shape in the stack structure, using the photoresist pattern.

According to an aspect of the present disclosure, there is provided a method of manufacturing a semiconductor device, the method including: forming a stack structure; forming channel holes corresponding to light transmission holes in the stack structure by performing a first photolithography process using an exposure mask that includes the light transmission holes; forming a cell plug including a channel layer in each of the channel holes; and forming a first wave-type slit in the stack structure by performing a second photolithography process using the exposure mask, wherein the first wave-type slit has a reversed shape with respect to a light irradiation region defined by allowing light to be transmitted through the light transmission holes.

The first photolithography process may include: forming a first mask layer on the stack structure; forming a first photoresist layer on the first mask layer; forming exposure regions spaced apart from each other in the first photoresist layer by exposing the first photoresist layer through the light transmission holes of the exposure mask; forming a first photoresist pattern by removing the exposure regions; forming a first mask pattern having opening holes by etching the first mask layer through an etching process using the first photoresist pattern as an etching barrier; and forming the channel holes by etching the stack structure exposed through the opening holes through an etching process using the first mask pattern as an etching barrier.

The second photolithography process may include: forming a second mask layer on the stack structure; forming a second photoresist layer on the second mask layer; forming an exposure region and a non-exposure region in the second photoresist layer by exposing the second photoresist layer through the light transmission holes, the exposure region corresponding to the light irradiation region and the non-exposure region corresponding to the reversed shape with respect to the light irradiation region; forming a second photoresist pattern by removing the non-exposure region; forming a second mask pattern having a trench corresponding to the non-exposure region by etching the second mask layer through an etching process using the second photoresist pattern as an etching barrier; and forming the first slit by etching the stack structure exposed through the trench through an etching process using the second mask pattern as an etching barrier.

The light transmission holes may include first light transmission holes and second light transmission holes spaced apart from the first light transmission holes with a first gap interposed therebetween. A gap between the first light transmission holes and a gap between the second light transmission holes may be formed smaller than the first gap not to be transferred to the exposure region.

An amount of light irradiated in the second photolithography process may be controlled greater than that of light irradiated in the first photolithography process such that some of the light transmission holes are transferred in a shape in which they are connected to each other.

According to an aspect of the present disclosure, there is provided a method of manufacturing a three-dimensional semiconductor device, the method including: forming a stack structure; patterning channel holes using light transmission holes of an exposure mask; forming cell plugs penetrating the stack structure; and patterning wave-type slits using light transmission holes of the exposure mask.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5, 6A, 6B, 7A to 7E, 8, 9A to 9D and 10 are views illustrating a manufacturing method of a semiconductor device in accordance with an embodiment of the present disclosure.

DETAILED DESCRIPTION

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure.

Various embodiments of the present invention provide a manufacturing method of a three-dimensional semiconductor device, which reduces the number of exposure masks employed for forming the three-dimensional semiconductor device.

Figure 1:
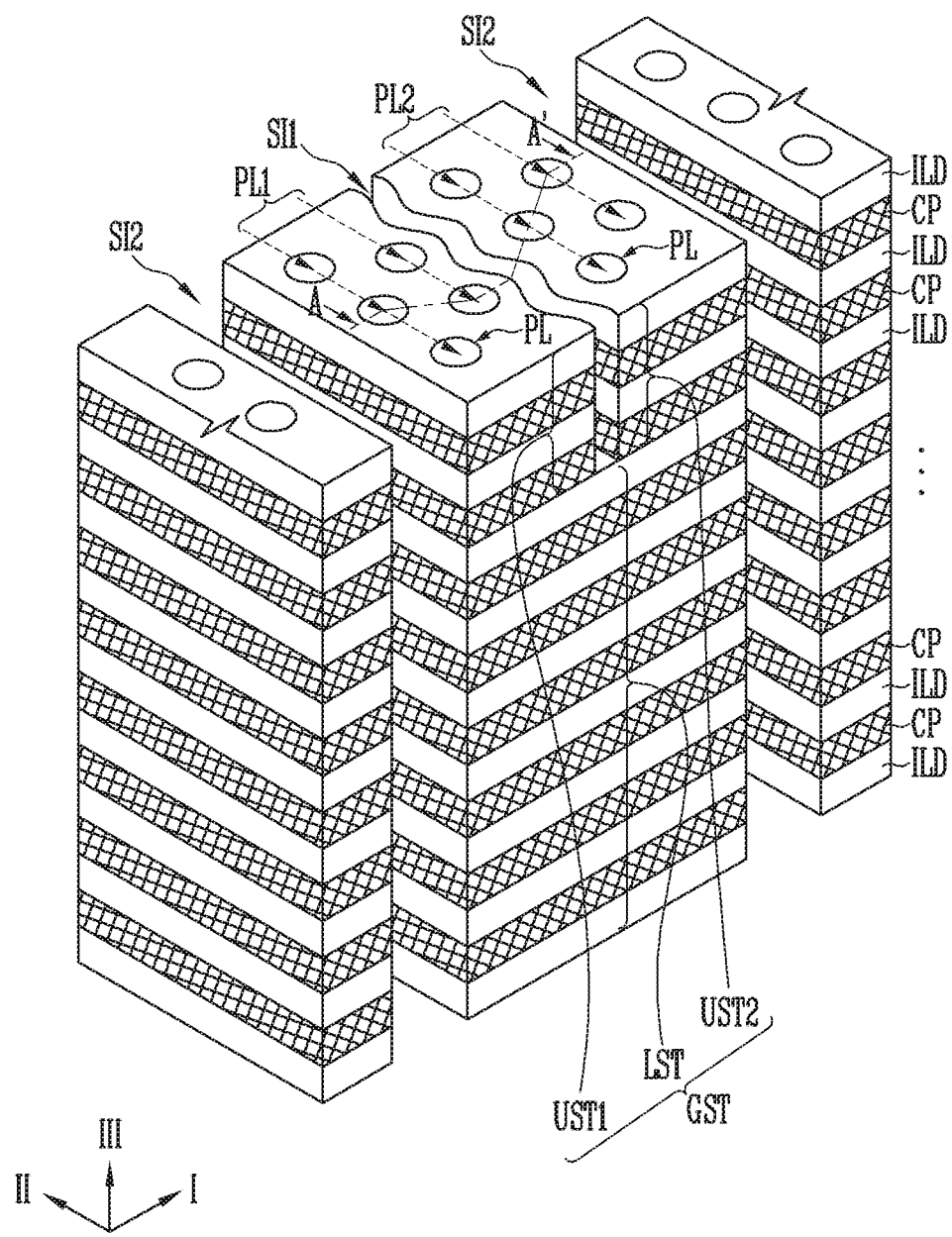
FIG. 1 is a perspective view illustrating a gate stack structure of a three-dimensional semiconductor device in accordance with an embodiment of the present disclosure.

FIG. 1 is a perspective view illustrating a gate stack structure of a three-dimensional semiconductor device according to an embodiment of the present disclosure. In FIG. 1, for convenience of description, illustration of structures disposed in a first slit SI1 and second slits SI2 will be omitted.

Referring to FIG. 1, the three-dimensional semiconductor device according to the embodiment of the present disclosure may include a plurality of gate stack structures GST. Each of the gate stack structures GST may include interlayer insulating layers ILD and conductive patterns CP, which are alternately stacked.

Among the interlayer insulating layers ILD and the conductive patterns CP, which are included in each of the gate stack structures GST, only some of them including at least the uppermost layer may be penetrated by the first slit SI1. The remaining interlayer insulating layers ILD and the conductive patterns CP may extend in first and second directions I and II and may not be penetrated by the first slit SI1 but overlap with the first slit SI1. That is, the first slit SI1 may be formed from the top of the gate stack structure GST and extend in a third direction III downwardly to a distance shorter than the second slits SI2 to penetrate only some of the uppermost interlayer insulating layers ILD and the conductive patterns CP. In an embodiment the first slit SI1 may extend to penetrate only the top insulating layer ILD and the top conductive pattern CP. In another embodiment as illustrated in FIG. 1, the first slit SI1 may extend to penetrate only the top two insulating layers ILD and the top two conductive patterns CP.

The first slit SI1 is disposed between two adjacent second slits in the first direction I which define a gate stack structure. Hence, each gate stack structure GST may be isolated from its adjacent gate stack structures GST by the second slits SI2. The first slit SI1 and the second slits SI2 extend along the second direction II intersecting the first direction I. The interlayer insulating layers ILD and the conductive patterns CP are stacked along the third direction III perpendicularly intersecting a horizontal plane along the first and second directions I and II.

According to the above-described structure, each gate stack structure GST is defined between the second slits SI2 adjacent to each other in the first direction I. The gate stack structure GST may include a lower stack structure LST, a first upper stack structure UST1, and a second upper stack structure UST2. The first upper stack structure UST1 and the second upper stack structure UST2 are disposed on the lower stack structure LST, and are disposed on the same plane. Each of the first upper stack structure UST1 and the second upper stack structure UST2 is disposed between the first slit SI1 and the second slit SI2, which are adjacent to each other. The lower stack structure LST extends along the first direction I and the second direction II to overlap with the first upper stack structure UST1, the second upper stack structure UST2, and the first slit SI1. The lower stack structure LST may be formed wider in the first direction I than each of the first upper stack structure UST1 and the second upper stack structure UST2. Each of the lower stack structure LST, the first upper stack structure UST1, and the second upper stack structure UST2 may include at least one pair of the interlayer insulating layers ILD and the conductive patterns CP.

Each of the gate stack structures GST is penetrated by cell plugs PL. The structure of each of the cell plugs PL will be described later with reference to FIGS. 3A and 3B. In order to improve the arrangement density of memory strings, the cell plugs PL may be arranged in a zigzag pattern along the first direction I and the second direction II. The cell plugs PL penetrating each of the gate stack structures GST may be divided into first cell plugs PL1 and second cell plugs PL2.

The first cell plugs PL1 penetrate the first upper stack structure UST1 and the lower stack structure LST. The second cell plugs PL2 penetrate the second upper stack structure UST2 and the lower stack structure LST. Accordingly, the first and second cell plugs PL1 and PL2 may be commonly controlled by the conductive patterns CP included in the lower stack structure LST. The first cell plugs PL1 are controlled by the conductive patterns CP included in the first upper stack structure UST1, and the second cell plugs PL2 are controlled by the conductive patterns CP included in the second upper stack structure UST2.

FIG. 1 illustrates a structure in which first cell plugs PL1 arranged on two columns which are shared by the first upper stack structure UST1 and a structure in which second cell plugs PL2 are arranged on two columns which are shared by the second upper stack structure UST2. The embodiment of the present disclosure is not limited to these structures. For example, the number of columns of cell plugs PL shared by each of the first and second upper stack structures UST1 and UST2 may be three or more columns or be one column.

The first slit SI1 according to the illustrated embodiment may be formed, for example, using an exposure mask used in a step of forming the cell plugs PL. For example, the first slit SI1 may be formed to have a wave shape sidewall with alternating concave and convex bends. For example, the first slit SI1 may be formed to be bent along the appearance of first cell plugs PL1 on a first column adjacent to the first slit SI1 and second cell plugs PL2 on the first column adjacent to the first slit SI1.

Memory cells of the three-dimensional semiconductor device may be connected in series to form a memory string. The memory cells of a memory string of the three-dimensional semiconductor device may be connected in series between select transistors by the cell plug PL. Hereinafter, the structure of memory strings of the three-dimensional semiconductor device will be described in detail with reference to FIG. 2.

Figure 2:
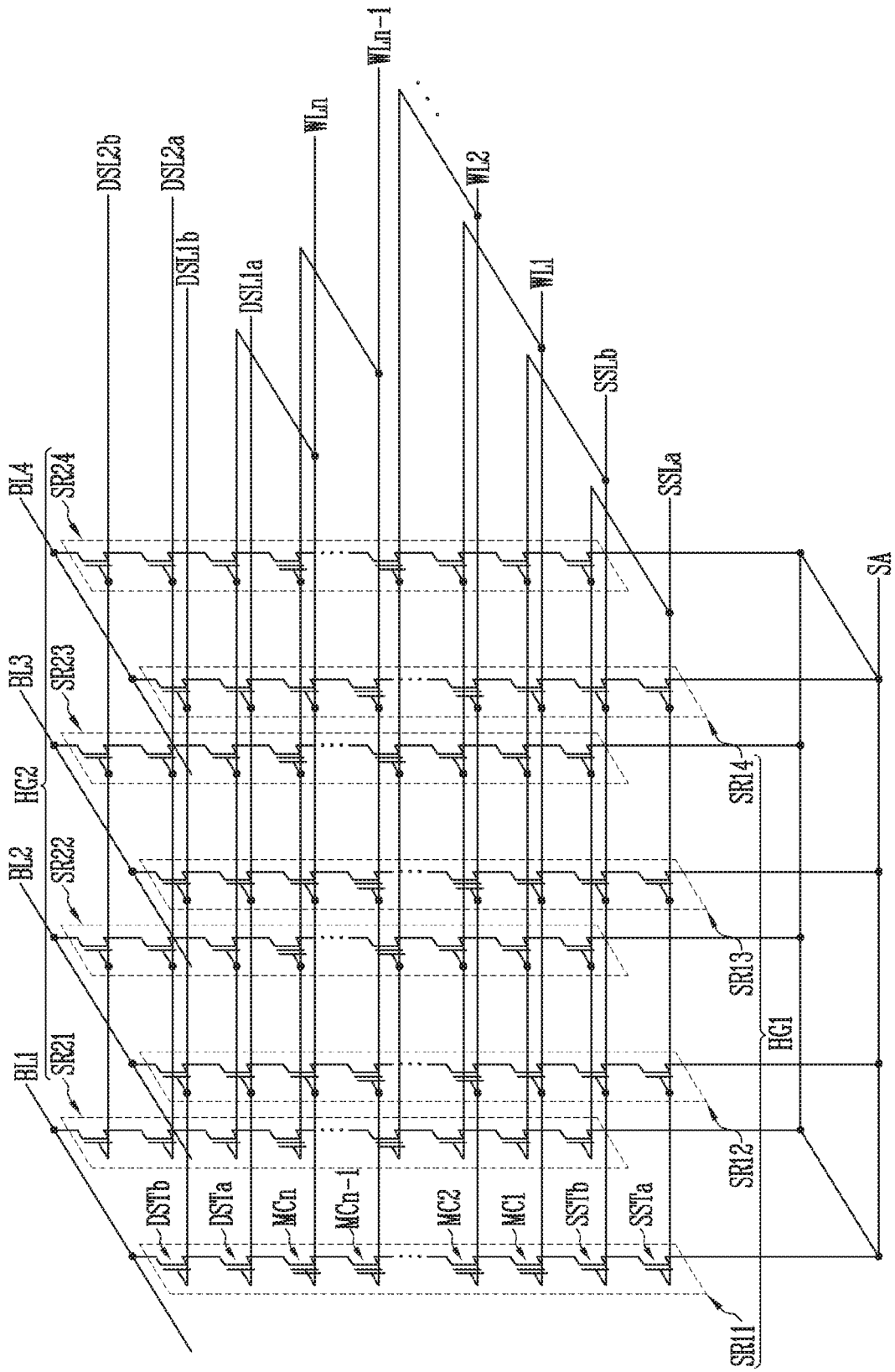
FIG. 2 is a circuit diagram of a three-dimensional semiconductor device to be implemented through the gate stack structure shown in FIG. 1.

FIG. 2 is a circuit diagram of a three-dimensional semiconductor device to be implemented through the gate stack structure shown in FIG. 1.

Referring to FIG. 2, the semiconductor device according to the embodiment of the present disclosure may include a plurality of memory strings SR11 to SR14 and SR21 to SR24 connected between bit lines BL1 to BL4 and a source region SA. Four bit lines BL1 to BL4 parallel to one another are illustrated in FIG. 2, but the number of bit lines is not limited thereto. The memory strings are divided into a first half group HG1 and a second half group HG2.

First memory strings SR11 to SR14 included in the first half group HG1 may be connected to the bit lines BL1 to BL4, respectively. Second memory strings SR21 to SR24 included in the second half group HG2 may be connected to the bit lines BL1 to BL4, respectively.

The first memory strings SR11 to SR14 and the second memory strings SR21 to SR24 may be arranged in a zigzag form so as to improve the degree of integration of the semiconductor device. The arrangement of the first memory strings SR11 to SR14 and the second memory strings SR21 to SR24 follows the arrangement of the cell plugs PL shown in FIG. 1. More specifically, the arrangement of the first memory strings SR11 to SR14 follows the arrangement of the first cell plugs PL1 shown in FIG. 1, and the arrangement of the second memory strings SR21 to SR24 follows the arrangement of the second cell plugs PL2 shown in FIG. 1.

Each of the first memory strings SR11 to SR14 and the second memory strings SR21 to SR24 may include a source select transistor SSTa or SSTb, a plurality of memory cell transistors MC1 to MCn (n is a natural number of 2 or more), and a drain select transistor DSTa or DSTb, which are connected in series by a channel layer of a cell plug. Each of the first memory strings SR11 to SR14 and the second memory strings SR21 to SR24 may include one drain select transistor DSTa or two or more drain select transistors DSTa and DSTb connected in series. Each of the first memory strings SR11 to SR14 and the second memory strings SR21 to SR24 may include one source select transistor SSTa or two or more source select transistors SSTa and SSTb connected in series.

Gates of the memory cell transistors MC1 to MCn are connected to respective word lines WL1 to WLn. The first half group HG1 and the second half group HG2 share each of the word lines WL1 to WLn.

Gates of the source select transistors SSTa and SSTb are connected to source select lines SSLa and SSLb, respectively. The source select lines SSLa and SSLb may be individually controlled or be connected to each other to be simultaneously controlled. The first half group HG1 and the second half group HG2 may share each of the source select lines SSLa and SSLb.

Gates of the drain select transistors DSTa and DSTb included in the first memory strings SR11 to SR14 are connected to first drain select lines DSL1a and DSL1b, respectively. Gates of the drain select transistors DSTa and DSTb included in the second memory strings SR21 to SR24 are connected to second drain select lines DSL2a and DSL2b, respectively. The first drain select lines DSL1a and DSL1b may be individually controlled or be connected to each other to be simultaneously controlled. The second drain select lines DSL2a and DSL2b may be individually controlled or be connected to each other to be simultaneously controlled. The first drain select lines DSL1a and DSL1b may be isolated from the second drain select lines DSL2a and DSL2b to be individually controlled.

According to the structure described in FIG. 2, the first half group HG1 and the second half group HG2 share the source select line SSLa or SSLb, but are controlled by the first drain select line DSL1a or DSL1b and the second drain select line DSL2a or DSL2b, respectively. More specifically, the first drain select line DSL1a or DSL1b may control the electrical connection between the first half group HG1 and the bit lines BL1 to BL4, and the second drain select line DSL2a or DSL2b may control the electrical connection between the second half group HG2 and the bit lines BL1 to BL4. Therefore, if one bit line and the first drain select line DSL1a or DSL1b are selected, one of the first memory strings SR11 to SR14 may be selected. In addition, if one bit line and the second drain select line DSL2a or DSL2b are selected, one of the second memory strings SR21 to SR24 may be selected.

The source select lines SSLa and SSLb and the word lines WL1 to WLn, which are shown in FIG. 2, correspond to the conductive patterns CP of the lower stack structure LST shown in FIG. 1, the first drain select lines DSL1a and DSL1b shown in FIG. 2 correspond to the conductive patterns CP of the first upper stack structure UST1 shown in FIG. 1, and the second drain select lines DSL2a and DSL2b shown in FIG. 2 correspond to the conductive patterns CP of the second upper stack structure UST2 shown in FIG. 1.

Figure 3A:
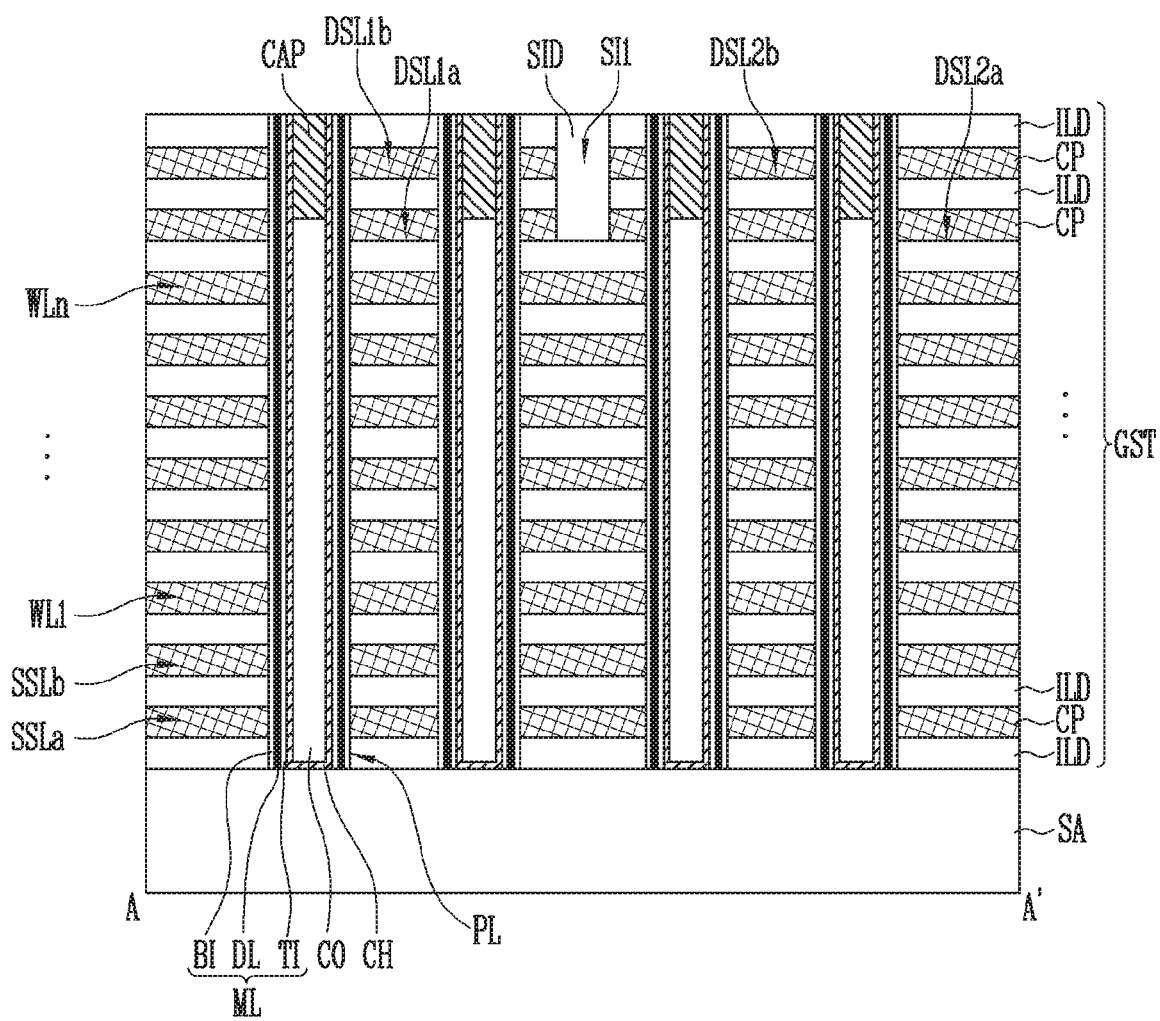
FIGS. 3A and 3B are sectional views illustrating various structures of semiconductor devices to be implemented through the gate stack structure shown in FIG. 1.
Figure 3B:
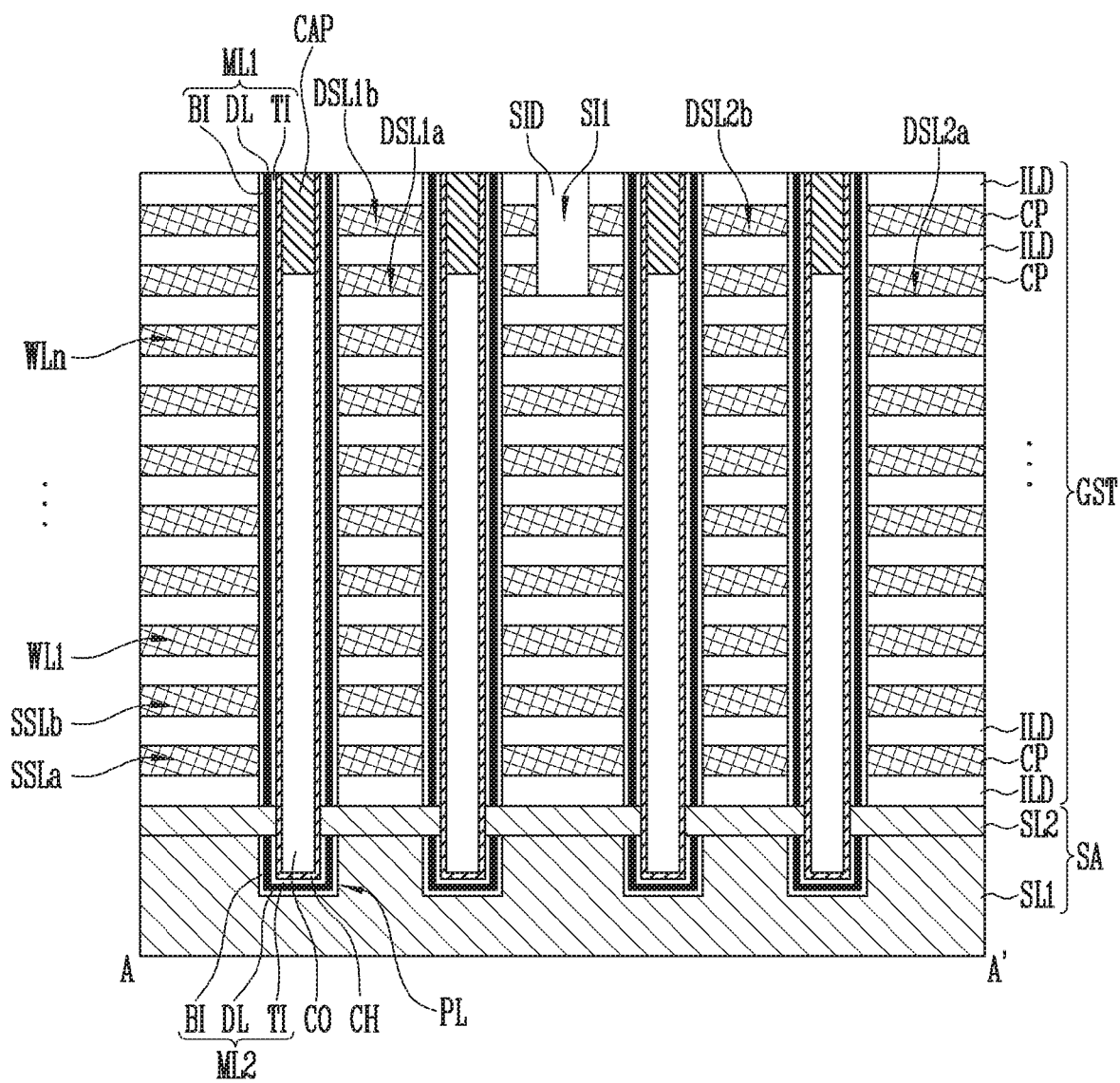

FIGS. 3A and 3B are sectional views illustrating various structures of semiconductor devices to be implemented through the gate stack structure shown in FIG. 1. Meanwhile, the circuit shown in FIG. 2 may be implemented using the semiconductor devices shown in FIGS. 3A and 3B. FIGS. 3A and 3B are sectional views taken along line A-A' shown in FIG. 1.

Referring to FIGS. 3A and 3B, a gate stack structure GST includes interlayer insulating layers ILD and conductive patterns CP, which are alternately stacked as described in FIG. 1. As described in FIG. 2, the conductive patterns CP may be used as source select lines SSLa and SSLb, word lines WL1 to WLn, and drain select lines DSL1a, DSL1b, DSL2a, and DSL2b. The conductive patterns CP may be formed of a conductive material such as doped silicon, metal silicide, metal, or barrier metal. Each of the conductive patterns CP may be formed of one kind of conductive material or be formed of two or more kinds of conductive materials.

A portion of the gate stack structure GST may be penetrated by a first slit SI1. A slit insulating layer SID may fill the first slit SI1. The first slit SI1 and the slit insulating layer SID may be disposed between the first and second drain select lines DSL1a/DSL1b and DSL2a/DSL2b. The first slit SI1 and the slit insulating layer SID may be formed to have a depth that does not penetrate the word lines WL1 to WLn and the source select lines SSLa and SSLb.

The gate stack structure GST surrounds the cell plugs PL. Each of the cell plugs PL may include a channel layer CH. The channel layer CH may be formed of a semiconductor layer. For example, the channel layer CH may be formed of a silicon layer. The channel layer CH is disposed in a hole penetrating the gate stack structure GST.

The channel layer CH may be a thin film surrounding a core insulating layer CO. The core insulating layer CO may fill in a central region of the hole penetrating the gate stack structure GST. The core insulating layer CO may be formed to have a top surface that is lower than the top surface of the channel layer CH. Hence, the height of the core insulating layer CO may be lower than the height of the channel layer. In this case, each of the cell plugs PL may further include a capping conductive pattern CAP formed on the core insulating layer CO to fill in an upper portion of the central region of the hole, which is defined by a top surface of the core insulating layer CO and an upper inner wall of the channel layer CH. The capping conductive pattern CAP may be in direct contact with the channel layer CH. The capping conductive pattern CAP may be formed of a semiconductor layer doped with a first conductivity type dopant. The first conductivity type dopant may be an n-type dopant. For example, the capping conductive pattern CAP may be a doped silicon layer doped with an n-type dopant. The capping conductive pattern CAP may be used as a drain junction.

Although not shown in the drawings, the capping conductive pattern CAP and the core insulating layer CO may be omitted. In this case, the channel layer CH may be formed to completely fill in the central region of the hole.

Each of the semiconductor devices according to the embodiments of the present disclosure may further include a source region SA. The source region SA may include a first conductivity type dopant. The channel layer CH may be connected to the source region SA. The source region SA and the channel layer CH may be connected to each other in various manners.

Referring to FIG. 3A, the channel layer CH may include a bottom surface that is in contact with the source region SA. In this case, each of the cell plugs PL may include a multi-layered memory pattern ML surrounding a sidewall of the channel layer CH. The multi-layered memory pattern ML may extend along an interface between the channel layer CH and the gate stack structure GST. The bottom surface of the channel layer CH may be in direct contact with the source region SA. In an embodiment, the source region SA may be formed of an n-type doped silicon layer.

According to the embodiment of FIG. 3B, the channel layer CH may extend to the inside of the source region SA. The source region SA may include a first source layer SL1 and a second source layer SL2. The second source layer SL2 may be disposed between the first source layer SL1 and the gate stack structure GST. The channel layer CH and the core insulating layer CO may extend to the inside of the first source layer SL1 by penetrating the second source layer SL2. Each of the first source layer SL1 and the second source layer SL2 may be formed of an n-type doped silicon layer. The second source layer SL2 may surround the sidewall of the channel layer CH to be in contact with the sidewall of the channel layer CH. In this case, each of the cell plugs PL may include a first multi-layered memory pattern ML1 and a second multi-layered memory pattern ML2.

The first multi-layered memory pattern ML1 may extend along the interface between the channel layer CH and the gate stack structure GST. The second multi-layered memory pattern ML2 may extend along an interface between the channel layer CH and the first source layer SL1. The first multi-layered memory pattern ML1 and the second multi-layered memory pattern ML2 may be isolated from each other by the second source layer SL2. The second multi-layered memory pattern ML2 between the first source layer SL1 and the channel layer CH may be used as a gate insulating layer.

Referring to FIGS. 3A and 3B, a portion of the multi-layered memory pattern ML1 or ML disposed between the drain select lines (DSL1a and DSL2a or DSL1b and DSL2b) and the channel layer CH or between the source select line SSLa or SSLb and the channel layer CH may be used as a gate insulating layer.

Although not shown in FIGS. 3A and 3B, a barrier layer that prevents each of the conductive patterns CP and the multi-layered memory pattern ML1 or ML from being in direct contact with each other may be further formed between each of the conductive patterns CP and the multi-layered memory pattern ML1 or ML. The barrier layer may include a titanium nitride layer, a tungsten nitride layer, a tantalum nitride layer, and the like.

Each of the multi-layered memory patterns ML1, ML2, and ML may include a tunnel insulating layer TI surrounding the channel layer CH, a data storage layer DL surrounding the tunnel insulating layer TI, and a blocking insulating layer BI surrounding the data storage layer DL. The data storage layer DL may store data changed using Fowler-Nordheim tunneling caused by a difference in voltage between the word lines WL1 to WLn and the channel layer CH, which are shown in FIGS. 3A and 3B. To this end, the data storage layer DL may be formed of various materials. For example, the data storage layer DL may be formed of a nitride layer in which charges can be trapped. In addition, the data storage layer DL may include silicon, a phase change material, nanodots, and the like. The blocking insulating layer BI may include an oxide layer capable of blocking charges. The tunnel insulating layer TI may be formed of a silicon oxide layer in which charge tunneling is available.

According to the structures described in FIGS. 3A and 3B, memory cell transistors are formed at intersection portions of the word lines WL to WLn and the channel layer CH, a source select transistor is defined at an intersection portion of the source select line SSLa or SSLb and the channel layer CH, and a drain select transistor is defined at an intersection portion of the drain select line DSL1a, DSL1b, DSL2a, or DSL2b and the channel layer CH. The memory cell transistors may be connected in series by the channel layer CH between the source select transistor and the drain select transistor, to form a memory string.

In an embodiment of the present disclosure, there is provided a manufacturing method of the semiconductor device, in which the first slit SI1 may be formed using an exposure mask including light transmission holes. Hereinafter, the manufacturing method of the semiconductor device according to the embodiment of the present disclosure will be described in more detail.

Figure 4:
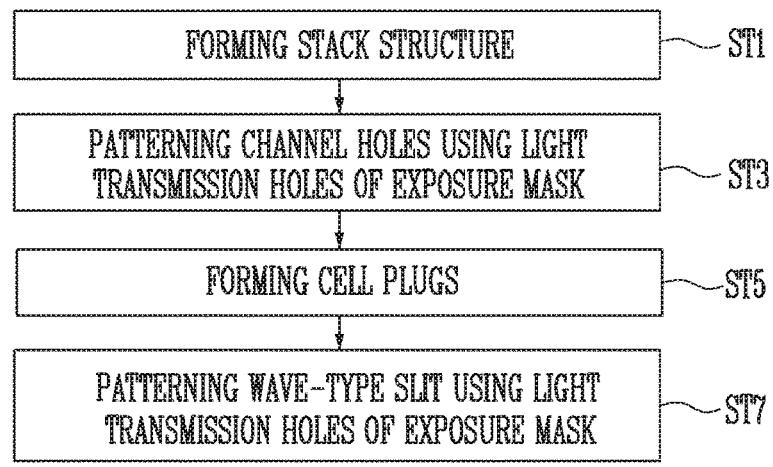
FIG. 4 is a flowchart of a manufacturing method of a semiconductor device in accordance with an embodiment of the present disclosure.

FIG. 4 is a flowchart of a manufacturing method of a semiconductor device according to an embodiment of the present disclosure. FIG. 4 illustrates steps ST1 to ST7. Although not shown in the drawing, a step of forming a source structure may be performed before the step ST1, and a process of forming bit lines, etc. may be performed after the step ST7.

Referring to FIG. 4, the step ST1 is a step of forming a stack structure in which first material layers and second material layers are alternately stacked.

The step ST3 is a step of patterning channel holes, using light transmission holes of an exposure mask. The step ST3 includes a first photolithography process. According to a first amount of light, gaps between the light transmission holes of the exposure mask may be transferred to a first photoresist layer. The first amount of light may be variously set according to designs of the exposure mask.

The step ST5 is a step of forming a cell plug including a channel layer in each of the channel holes formed through the step ST3.

The step ST7 is a step of patterning a wave-type slit, using light transmission holes of an exposure mask. The exposure mask of the step ST7 is the same as the exposure mask of the step ST3. The step ST7 includes a second photolithography process. The second photolithography process includes an exposure process controlled with a second amount of light, which is greater than the first amount of light. The second amount of light is controlled such that a light irradiation region defined by allowing light to be transmitted through the light transmission holes of the exposure mask has an area wider than that of each of the light transmission holes. The second amount of light may be variously set according to designs of the exposure mask. Since the second amount of light is controlled greater than the first amount of light, a shape projected by the exposure process according to the first amount of light may be different from that projected by the exposure process according to the second amount of light. According to the second amount of light, narrow gaps between the light transmission holes may not be transferred to a second photoresist layer.

In the above, the steps ST3 and ST5 may be performed after the step ST7.

According to the embodiment of the present disclosure described above, channel holes and a slit having a shape different from that of the channel holes may be formed using one exposure mask. Accordingly, in the embodiment of the present disclosure, the number of exposure masks required in the manufacturing process of the three-dimensional semiconductor device may be decreased, so that manufacturing cost of the three-dimensional semiconductor device may be reduced. Hereinafter, the steps shown in FIG. 4 will be described in more detail.

FIGS. 5, 6A, 6B, 7A to 7E, 8, 9A to 9D and 10 are views illustrating a manufacturing method of a semiconductor device according to an embodiment of the present disclosure. FIGS. 5, 6A, 6B, 7A to 7E, 8, 9A to 9D and 10 illustrate an example of a manufacturing method of the semiconductor device shown in FIG. 3A. In FIGS. 5, 6A, 6B, 7A to 7E, 8, 9A to 9D and 10, sectional views are sectional views taken along the line A-A' shown in FIG. 1

Figure 5:
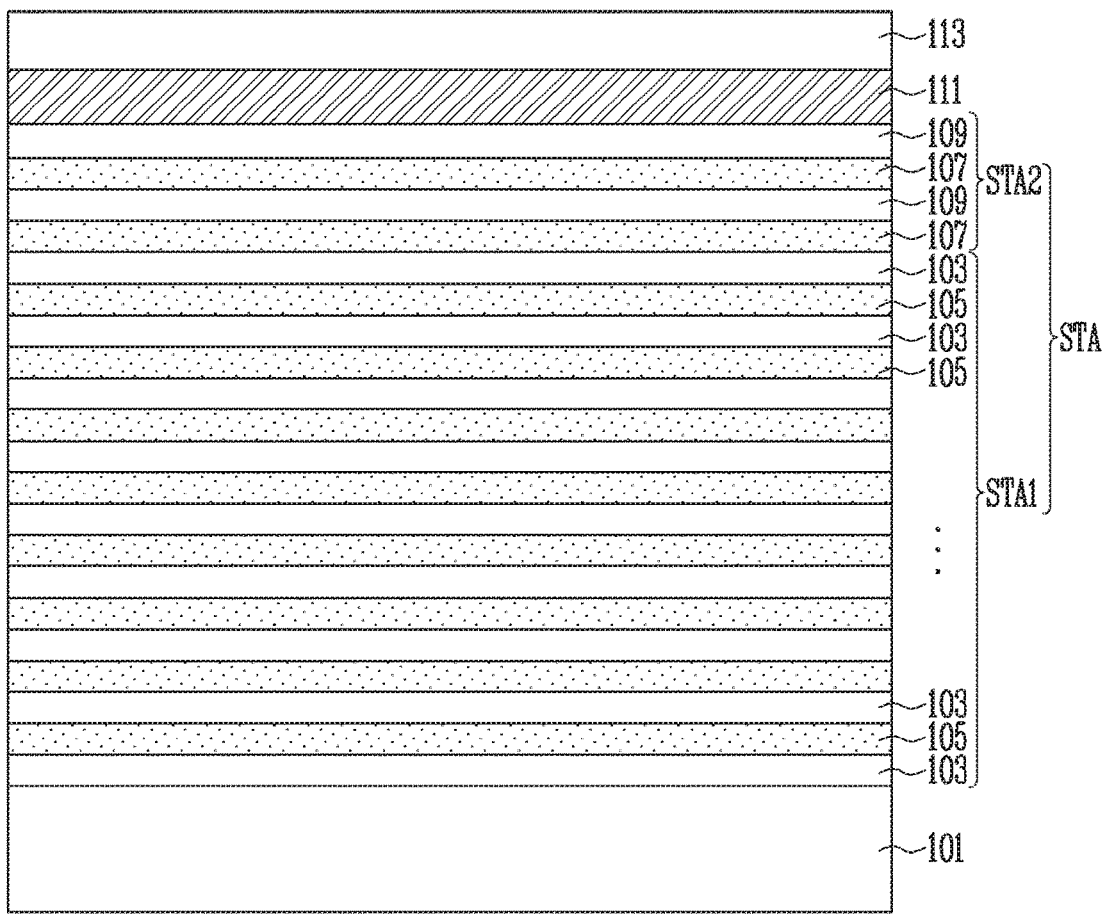

FIG. 5 is a sectional view illustrating the step ST1 shown in FIG. 4.

Referring to FIG. 5, a stack structure STA formed in the step ST1 may be formed on a source region 101. The source region 101 may be formed on a substrate (not shown) on which a driving circuit is formed. The source region 101 may be formed of a doped silicon layer including a first conductivity type dopant. The first conductivity type dopant may be an n-type dopant.

The step of forming the stack structure STA may include a step of forming a first stack structure STA1 and a step of forming a second stack structure STA2 on the first stack structure STA1. The first stack structure STA1 may be formed on the source region 101 by alternately stacking first material layers 103 and second material layers 105. The second stack structure STA2 may include at least one pair of a third material layer 107 and a fourth material layer 109. The third material layer 107 may be formed of the same material as the second material layer 105. The fourth material layer 109 may be formed of the same material as the first material layer 103. The first and fourth material layers 103 and 109 may be formed of a material different from that of the second and third material layers 105 and 107.

As a first case, the first and fourth material layers 103 and 109 may be formed of a first insulating material, and the second and third material layers 105 and 107 may be formed of a second insulating material having an etching rate different from that of the first insulating material. The first insulating material may be selected from various materials capable of serving as an interlayer insulating layer. For example, the first insulating material may include a silicon oxide layer. The second insulating material is a sacrificial material, and may be selected from various materials having an etching rate larger than that of the first insulating material. For example, the second insulating material may include a silicon nitride layer. According to the first case, the stack structure STA may include interlayer insulating layers and sacrificial layers, which are alternately stacked one by one.

As a second case, the first and fourth material layers 103 and 109 may be formed of the first insulating material described above, and the second and third material layers 105 and 107 may be formed of a conductive material. The conductive material may include at least one of a doped silicon layer, a metal silicide layer, and a metal layer. A low-resistance metal such as tungsten may be used as the conductive material so as to form a low-resistance line. According to the second case, the stack structure STA may include interlayer insulating layers and gate conductive layers, which are alternately stacked one by one.

As a third case, the first and fourth material layers 103 and 109 may be formed of a gate conductive material, and the second and third material layers 105 and 107 may be formed of a sacrificial conductive material having an etching rate different from that of the gate conductive material. The gate conductive material may include at least one of a doped silicon layer, a metal silicide layer, and a metal layer. The sacrificial conductive material may be selected from various materials having an etching rate larger than that of the gate conductive material. More specifically, the gate conductive material may be formed of a doped silicon layer, and the sacrificial conductive material may be formed of an undoped silicon layer. According to the third case, the stack structure STA may include sacrificial conductive layers and gate conductive layers, which are alternately stacked one by one.

Subsequently, the step ST3 shown in FIG. 4 may be performed. The step ST3 may include a step of sequentially stacking a first mask layer 111 and a first photoresist layer 113 on the stack structure STA. The first mask layer 111 may include a nitride layer. The first photoresist layer 113 may be formed as a positive resist layer.

The step ST3 may include an exposure process of allowing the first photoresist layer 113 to be exposed by light transmitted through an exposure mask. Hereinafter, a layout of the exposure mask used in the step ST3 and a first exposure region and a first non-exposure region, which are formed in the first photoresist layer 113 in the step ST3, will be described in more detail.

Figure 6A:
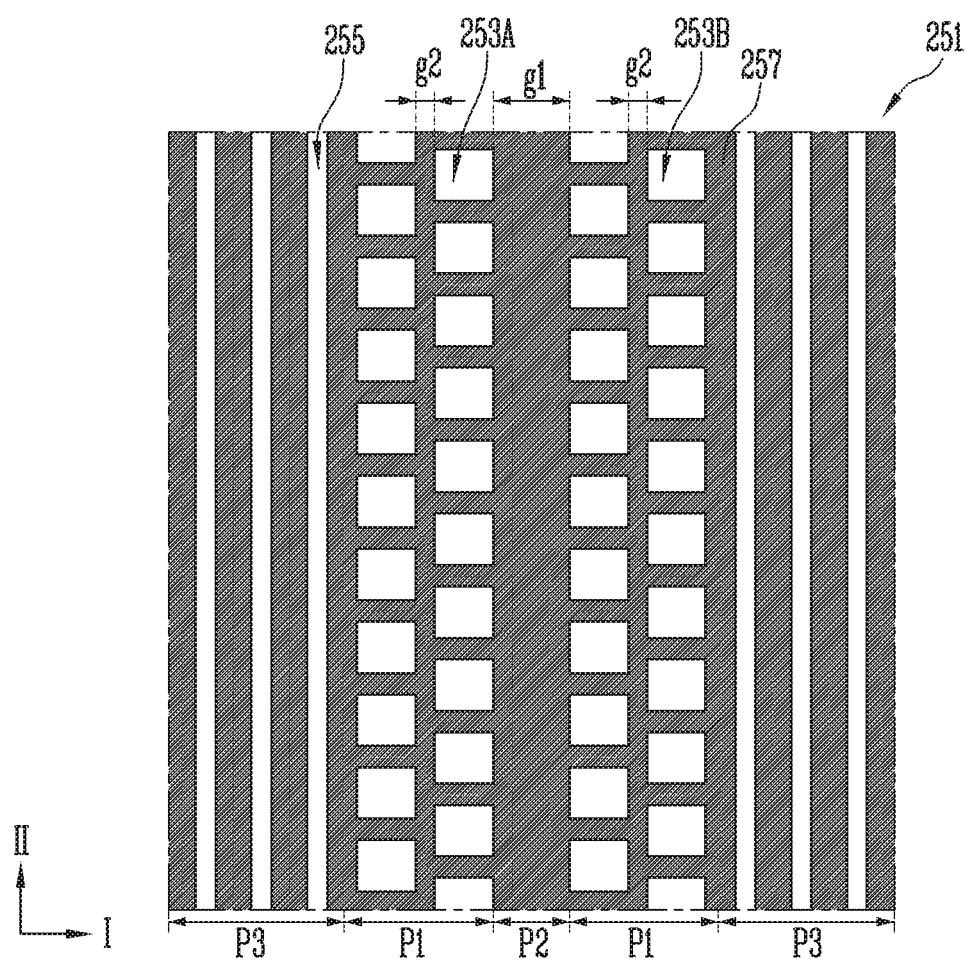
Figure 6B:
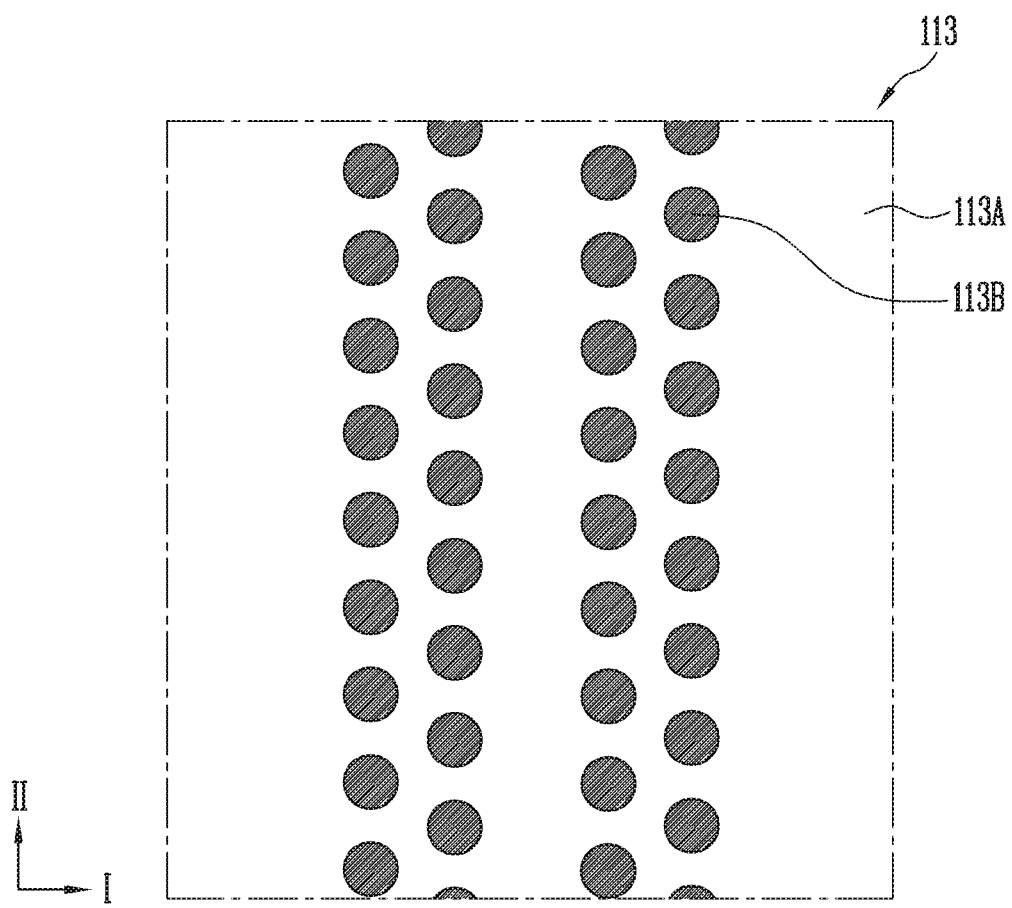

FIGS. 6A and 6B are plan views illustrating the step ST3 shown in FIG. 4. More specifically, FIG. 6A is a plan view illustrating a layout of an exposure mask used in the step ST3. FIG. 6B is a plan view illustrating first exposure regions and a first non-exposure region, which are defined in the first photoresist layer by light transmitted through the exposure mask shown in FIG. 6A.

Referring to FIG. 6A, the exposure mask 251 may include light transmission holes 253A and 253B, transparent assist features (AFs) 255, and a light blocking pattern 257. The light transmission holes 253A and 253B may be arranged to be spaced apart from each other at a first gap g1 or a second gap g2 along the first direction I. The first gap g1 may be larger than the second gap g2. The light transmission holes 253A and 253B may be arranged in a zigzag pattern so as to increase the arrangement density of channel holes.

The exposure mask 251 may include first to third regions P1 to P3. The light transmission holes 253A or 253B spaced apart from each other at the second gap g2 are disposed in each of the first regions P1. The second region P2 is defined between adjacent first regions P1 in a first direction I. The third regions P3 are regions extending from the first regions P1 disposed at both sides of the second region P2. That is, each of the third regions P3 is opposite to the second region P2 with one of the first regions P1, which is interposed therebetween. The arrangement of the first to third regions P1 to P3, which is shown in the drawing, may be repeated along the first direction I.

The light transmission holes 253A and 253B may be divided into first light transmission holes 253A and second light transmission holes 253B. The first light transmission holes 253A are disposed in the first region P1 adjacent to one side of the second region P2 to be spaced apart from each other at the second gap g2, and the second light transmission holes 253B are disposed in the first region P1 adjacent to the other side of the second region P2 to be spaced apart from each other at the second gap g2. The first light transmission holes 253A included in a column adjacent to the second region P2 are spaced apart from the second light transmission holes 253B included in a column adjacent to the second region P2 at the first gap g1 larger than the second gap g2. The second region P2 has a width corresponding to the first gap g1 in the first direction I. The second region P2 is completely blocked by the light blocking pattern 257.

The first light transmission holes 253A, the second light transmission holes 253B, and the second region P2 are disposed between two adjacent third regions P3 in the first direction I. Each of the third regions P3 may have a width larger than that of the second region P2 in the first direction I. The transparent assist features 255 are disposed to be spaced apart from each other along the first direction I in each of the third regions P3.

It may be determined whether the transparent assist features 255 is to be transferred, according to a first amount of light irradiated in a first photolithography process and a second amount of light irradiated in a second photolithography process.

The light transmission holes 253A and 253B may be transferred in different shapes according to the first amount of light irradiated in the first photolithography process and the second amount of light irradiated in the second photolithography process.

According to the first amount of light irradiated in an exposure process of the first photolithography process, the shapes of the light transmission holes 253A and 253B are transferred to the inside of the first photoresist layer 113 shown in FIG. 5, and the shapes of the transparent assist features 255 are not transferred to the inside of the first photoresist layer 113. The transparent assist features 255 may be used as patterns that ensure a depth of focus (DOF) margin and improve aberration when the exposure process of the first photolithography process is performed. In the first photolithography process, the transparent assist features 255 of the third regions P3 are not transferred to the inside of the first photoresist layer 113, and all of the third regions P3 may be used as a light blocking region.

Although not shown in the drawings, the transparent assist features 255 may be transferred to the inside of the first photoresist layer 113. Accordingly, the density of photoresist patterns may be become more uniform through the transfer region of the transparent assist features 255. Since the width of the transfer region of the transparent assist features 255 is narrow, the transparent assist features 255 are not printed in a first mask layer formed in a subsequent process of the step ST3.

Referring to FIG. 6B, light transmitted through the light transmission holes 253A and 253B of the exposure mask 251 shown in FIG. 6A by the exposure process of the first photolithography process performed according to the first amount of light forms first exposure regions 113B in the first photoresist layer 113. The first exposure regions 113B correspond to the shapes of the light transmission holes 253A and 253B transferred with the first amount of light according to a normal dose energy. Each of the first exposure regions 113B is surrounded by a first non-exposure region 113A. The first non-exposure region 113A has a shape corresponding to the first and second gaps g1 and g2 of the exposure mask 251 and the third regions P3.

The first exposure regions 113B of the first photoresist layer 113 formed of the positive resist layer may be dissolved in a state in which they are soluble in a developer.

FIGS. 7A to 7E are sectional views illustrating the steps ST3 and ST5.

Figure 7A:
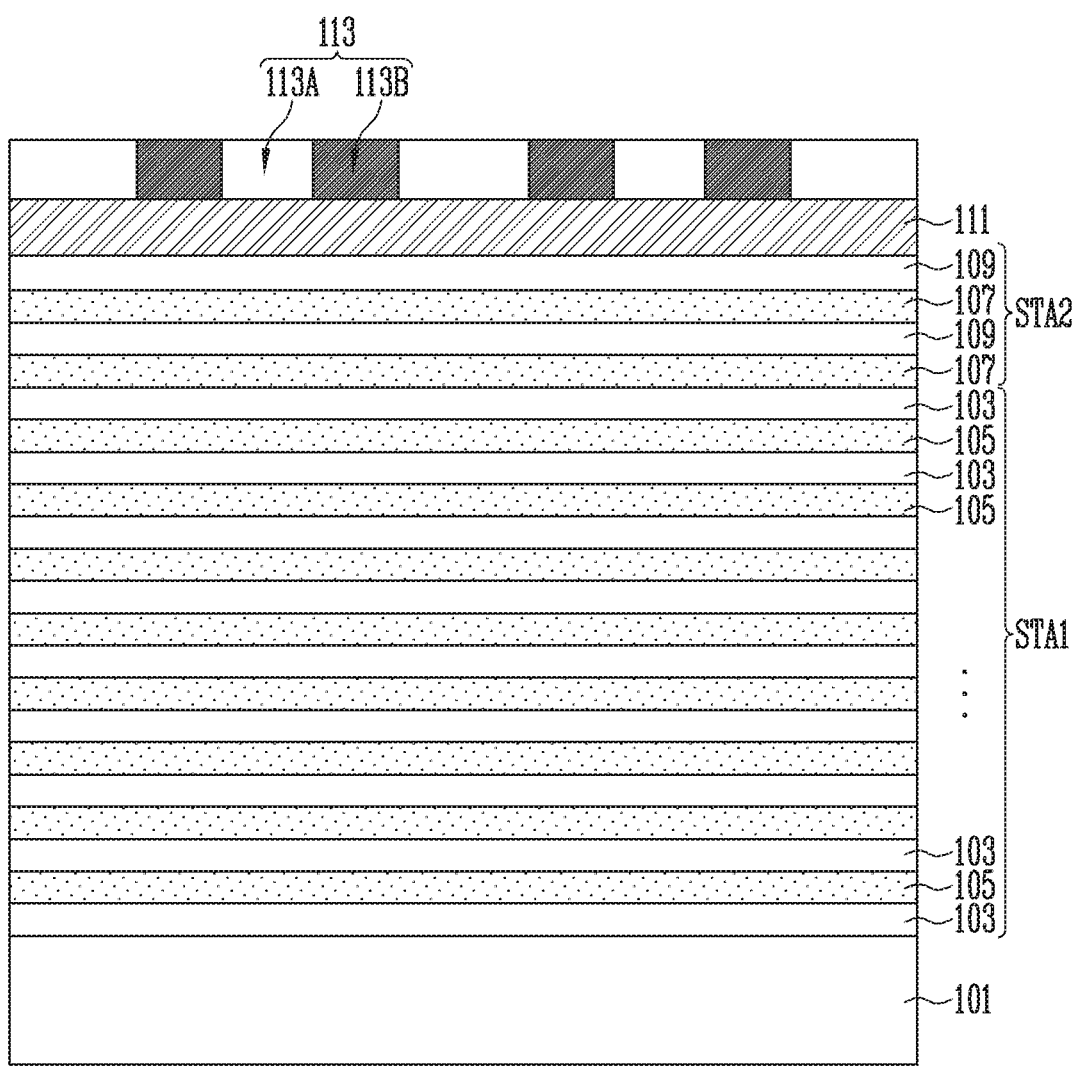

Referring to FIG. 7A, the first non-exposure region 113A and the first exposure regions 113B in the first photoresist layer 113 are formed by the exposure process of the step ST3 as described in FIG. 6B.

Figure 7B:
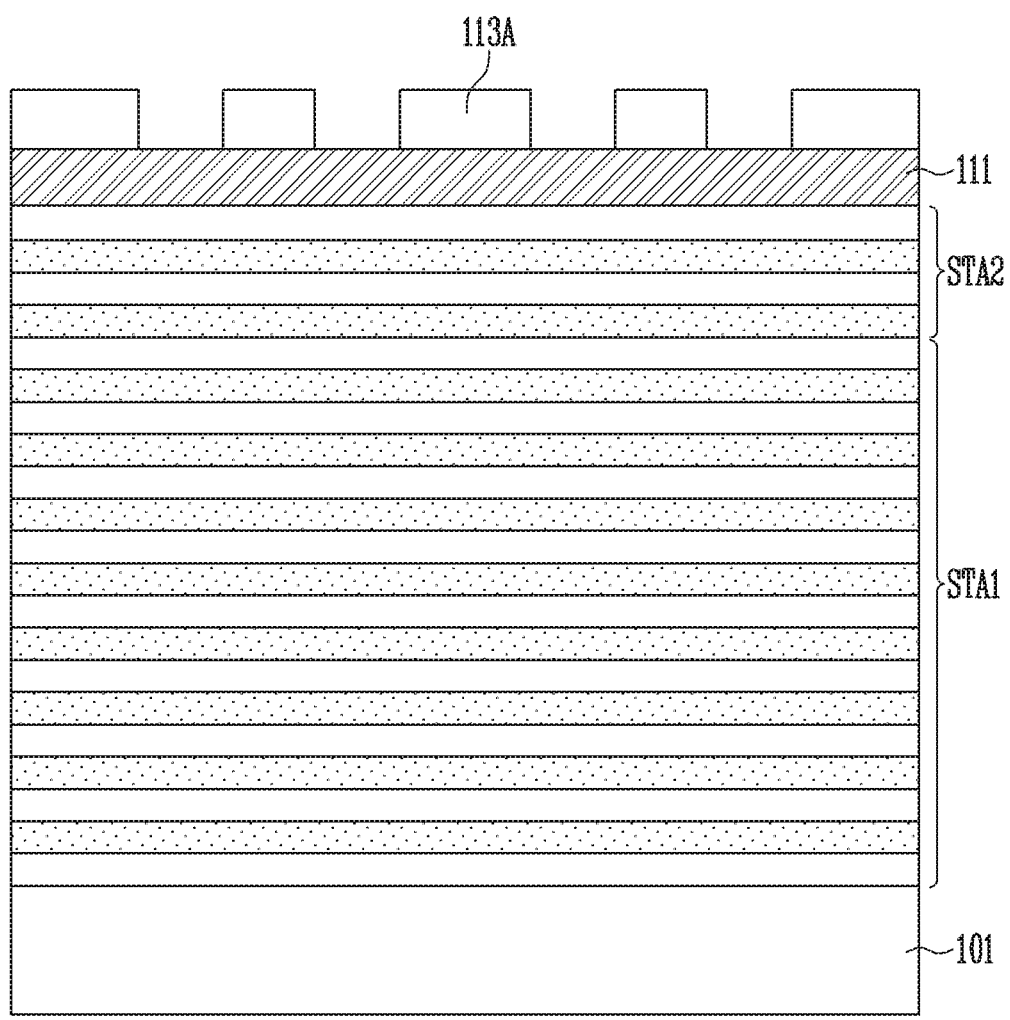

Referring to FIG. 7B, the step ST3 may include a step of removing the first exposure regions 113B shown in FIG. 7A, using a developer, after the exposure process is performed. Accordingly, the first non-exposure region 113A remains as a first photoresist pattern.

Referring to FIG. 7C, the step ST3 may include a step of forming a first mask pattern 111P by etching the first mask layer through an etching process using the first non-exposure region 113A as an etching barrier. The first mask pattern 111P includes opening holes corresponding to the transferred shapes of the light transmission holes 253A and 253B shown in FIG. 6A.

Figure 7D:
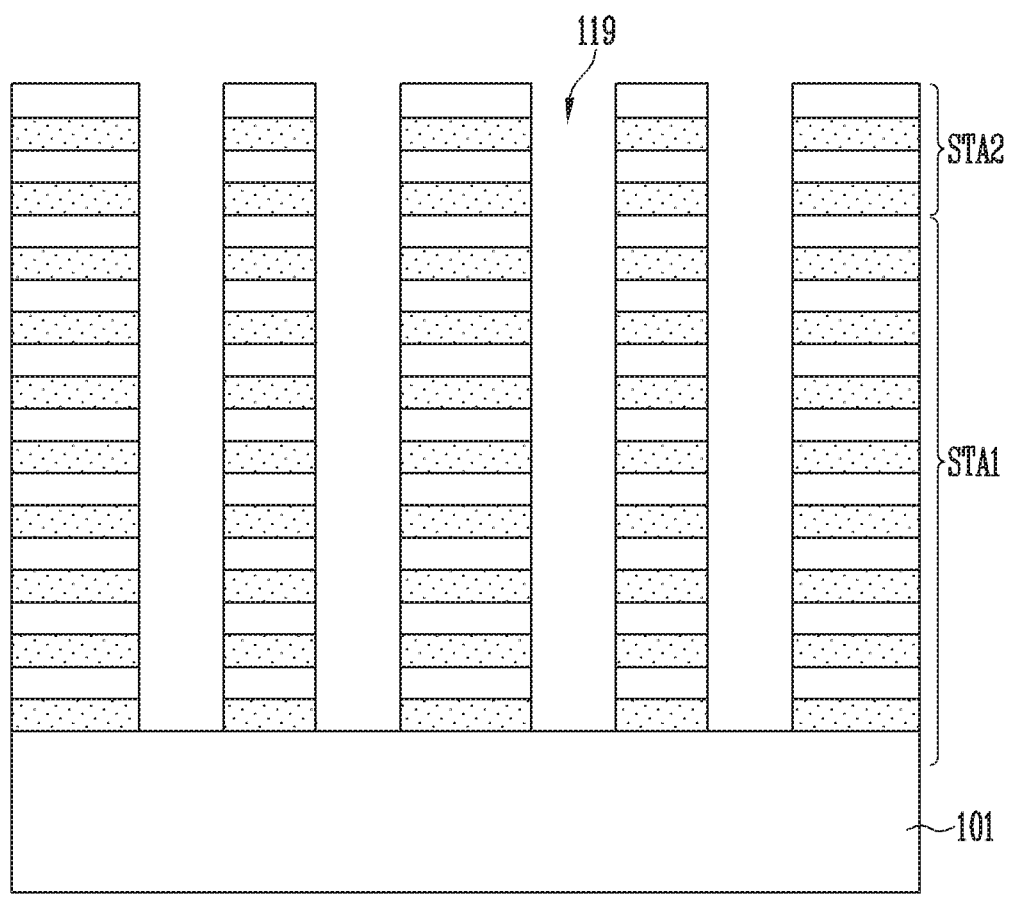

Referring to FIG. 7D, channel holes 119 are formed by etching the second stack structure STA2 and the first stack structure STA1, which are exposed through the opening holes 117 shown in FIG. 7C, through an etching process using the first mask pattern 111P shown in FIG. 7C as an etching barrier. The first mask pattern 111P may be removed after the channel holes 119 are formed.

The channel holes 119 correspond to the transferred shapes of the light transmission holes 253A and 253B shown in FIG. 6A. The channel holes 119 may be formed to completely penetrate the first stack structure STA1 and the second stack structure STA2.

Figure 7E:
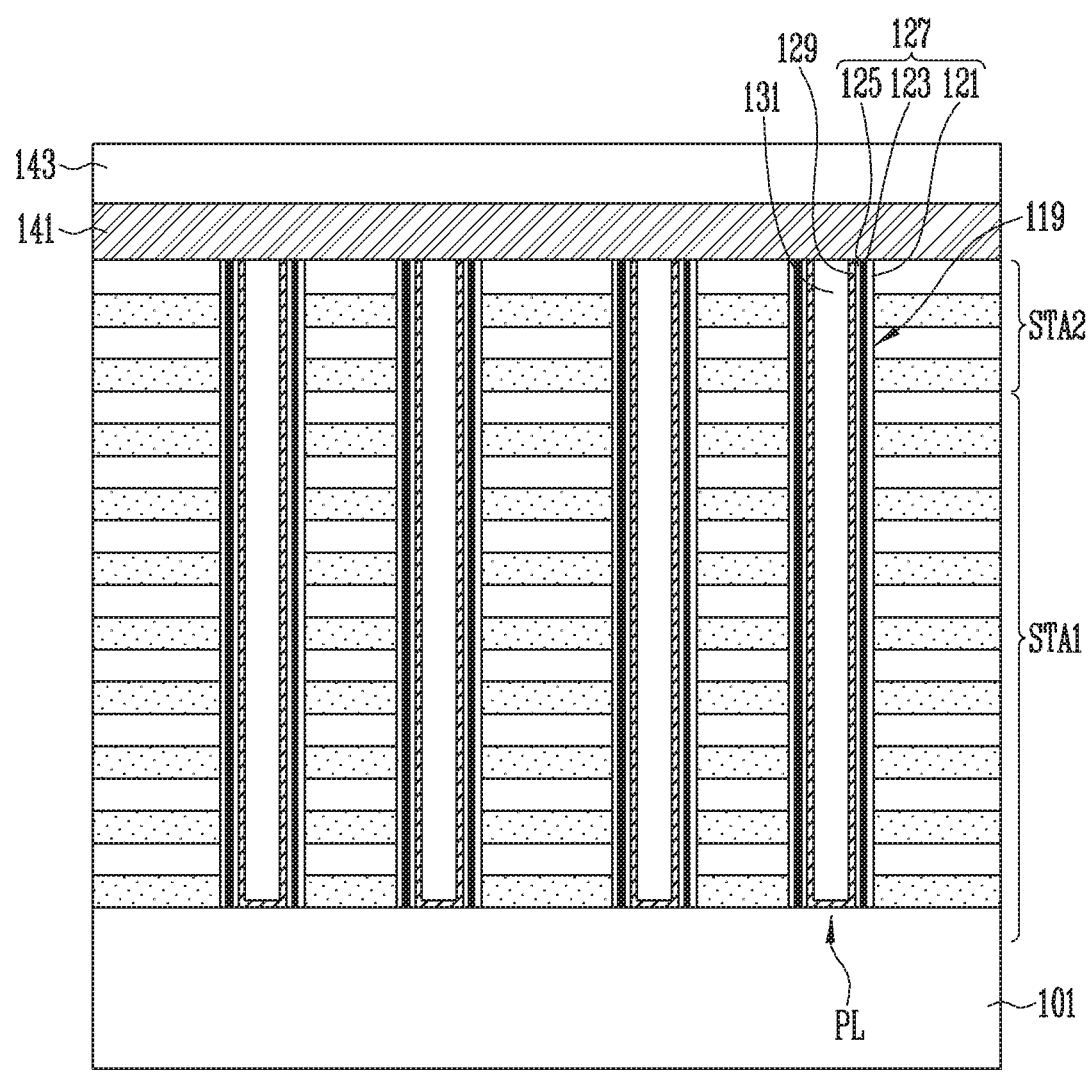

Referring to FIG. 7E, the step ST5 may include a step of forming a multi-layered memory pattern 127 on a sidewall of each of the channel holes 119 and a step of forming a channel layer 129 along a surface of the multi-layered memory pattern 127 and a surface of the source region 101.

The step of forming the multi-layered memory pattern 127 may include a step of forming a blocking insulating layer 121 along the surface of each of the channel holes 119, a step of forming a data storage layer 123 on the blocking insulating layer 121, a step of forming a tunnel insulating layer 125 on the data storage layer 123, and a step of exposing the source region 101 through a bottom surface of each of the channel holes 119 by etching the blocking insulating layer 121, the data storage layer 123, and the tunnel insulating layer 125.

The channel layer 129 may be formed to allow a central region of each of the channel holes 119 to be opened. In this case, the central region of each of the channel holes 119, which is opened by the channel layer 129, may be filled with a core insulating layer 131. In an embodiment, the core insulating layer 131 may be formed using polysilazane (PSZ).

Through the above-described processes, a cell plug PL including the multi-layered memory pattern 127 and the channel layer 129 is formed in each of the channel holes 119.

After the step ST5, the step ST7 may be performed. The step ST7 may include a step of forming a second mask layer 141 on the second stack structure STA2 and a step of forming a second photoresist layer 143 on the second mask layer 141. After that, an exposure process of a second photolithography process may be performed, in which the second photoresist layer 143 is exposed by light transmitted through the exposure mask shown in FIG. 6A.

Figure 8:
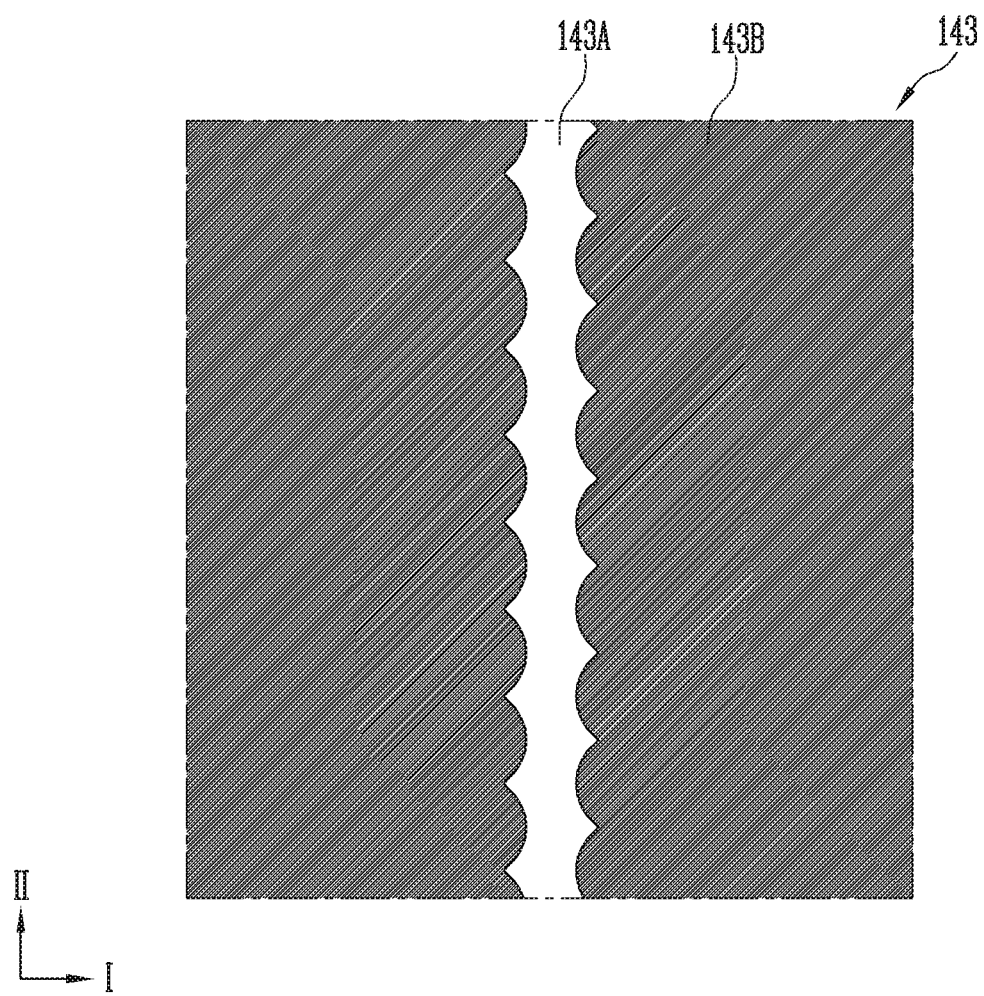

FIG. 8 is a plan view illustrating a layout of second exposure regions and a second non-exposure region of the second photoresist layer according the second photolithography process using the exposure mask shown in FIG. 6A.

According to the second amount of light irradiated in the exposure process of the second photolithography process, the second gaps g2 between the light transmission holes 253A and 253B shown in FIG. 6A are not transferred to the inside of the second photoresist layer 143. According to the second amount of light irradiated in the exposure process of the second photolithography process, the light transmission holes 253A and 235B and the transparent assist features 255, which are shown in FIG. 6A, may be transferred in a shape enlarged in the second photoresist layer 143.

The second amount of light is higher than the first amount of light irradiated in the first lithography process. Thus, light transmitted through the light transmission holes 253A and 253B and the transparent assist features 255 of the exposure mask 251 shown in FIG. 6A by the exposure process according to the second amount of light forms second exposure regions 143B having a shape different from that of the first exposure regions in the second photoresist layer 143. Each of the second exposure regions 143B is a light irradiation region. The second exposure regions 143B correspond to a connection shape between the first light transmission holes 253A and the transparent assist features 255 adjacent thereto, or correspond to a connection shape between the second transmission holes 253B and the transparent assist features 255 adjacent thereto. The transferred shapes in the second photoresist layer 143 are determined by the second amount of light according to over-dose energy. Since light having the second amount of light is transmitted through the transparent assist features 255, the third regions P3 of the exposure mask 251 may be used as light transmission regions in the second photolithography process.

According to the second amount of light, the first gap g1 larger than each of the second gaps g2 of the exposure mask 251 shown in FIG. 6A may be transferred to the inside of the second photoresist layer 143. A second non-exposure region 143A of the second photoresist layer 143 corresponds to the transferred shape of the first gap g1. The transferred shape of the first gap g1 has a reversed shape with respect to the light irradiation region.

The second region P2 described in FIG. 6A is blocked by the light blocking pattern 257 having a width corresponding to the first gap g1. The second region P2 may be used as a light blocking region in not only the first photolithography process but also the second photolithography process of performing the exposure process by increasing the amount of light. Due to the layout of the first to third regions P1 to P3 described in FIG. 6A and the exposure process according to the second amount of light, the second exposure regions 143B may be spaced apart from each other with the second non-exposure region 143A interposed therebetween.

The second exposure regions 143B of the second photoresist layer 143 formed of a negative resist layer may be cured in a state in which they are not dissolved in a developer.

FIGS. 9A to 9D are sectional views illustrating the step ST7.

Referring to FIG. 9A, the second non-exposure region 143A and the second exposure regions 143B are formed in the second photoresist layer 143 by the exposure process of the step ST7 as described in FIG. 8.

Figure 9B:
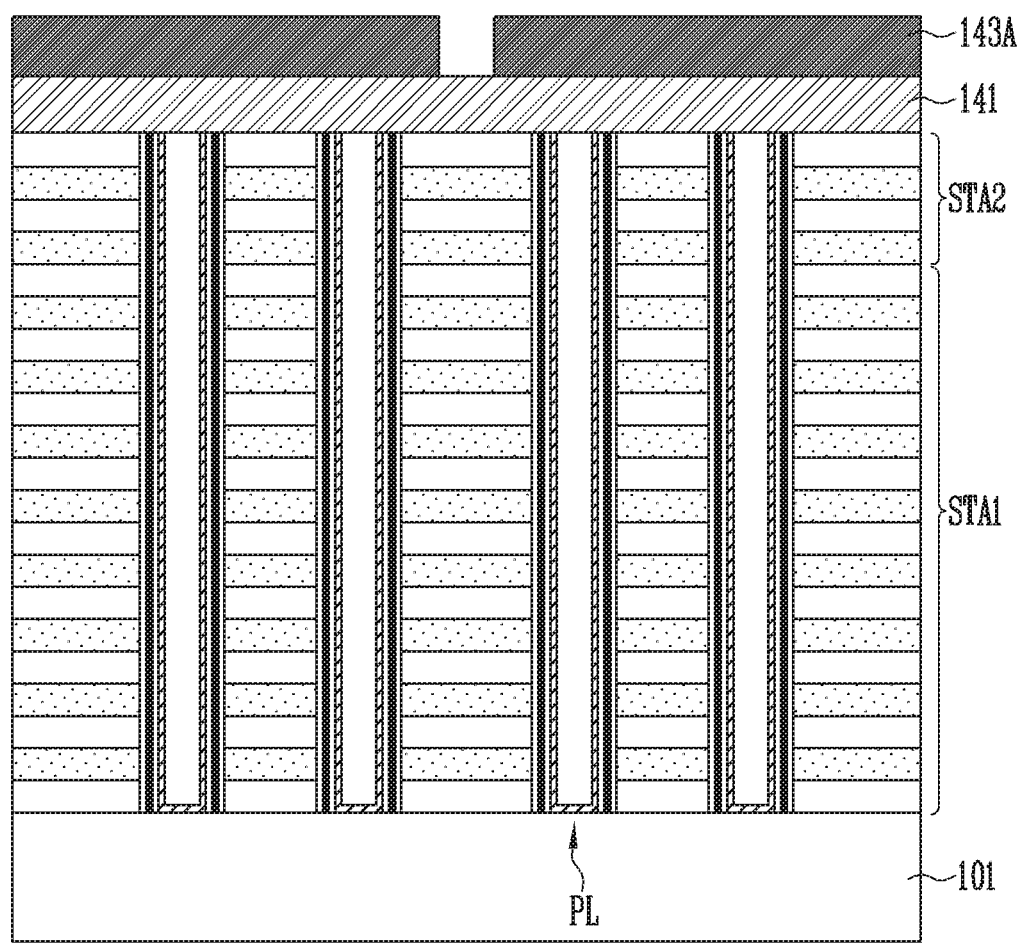

Referring to FIG. 9B, the step ST7 may include a step of removing the second non-exposure region 143A shown in FIG. 9A, using a developer, after the exposure process. Accordingly, the second exposure regions 143B remain as a second photoresist pattern.

Figure 9C:
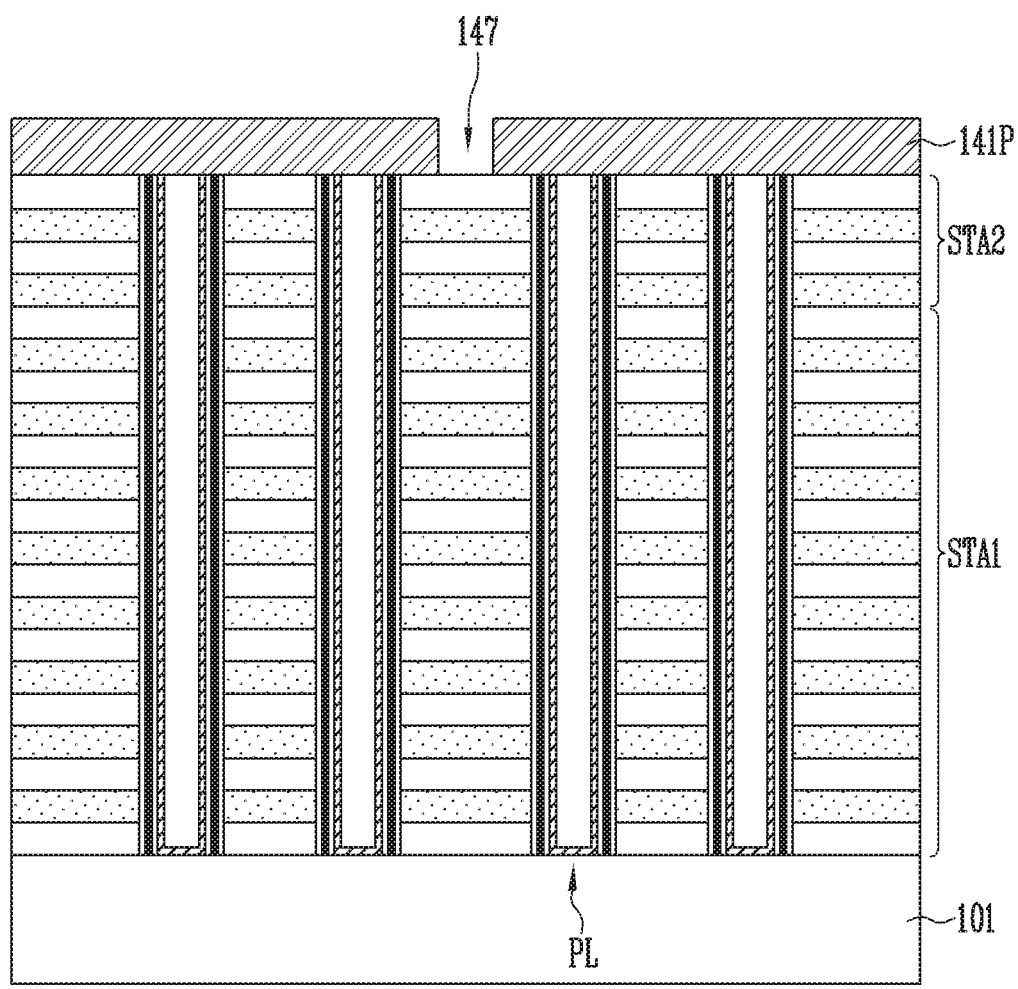

Referring to FIG. 9C, the step ST7 may include a step of forming a second mask pattern 141P by etching the second mask layer through an etching process using the second exposure regions 143B as an etching barrier. The second mask pattern 141P includes a trench 147 corresponding to the second non-exposure region 143A shown in FIG. 8. That is, the trench 147 may be formed to be of a wave type to have a reversed shape with respect to the light irradiation region in the second photolithography process.

Figure 9D:
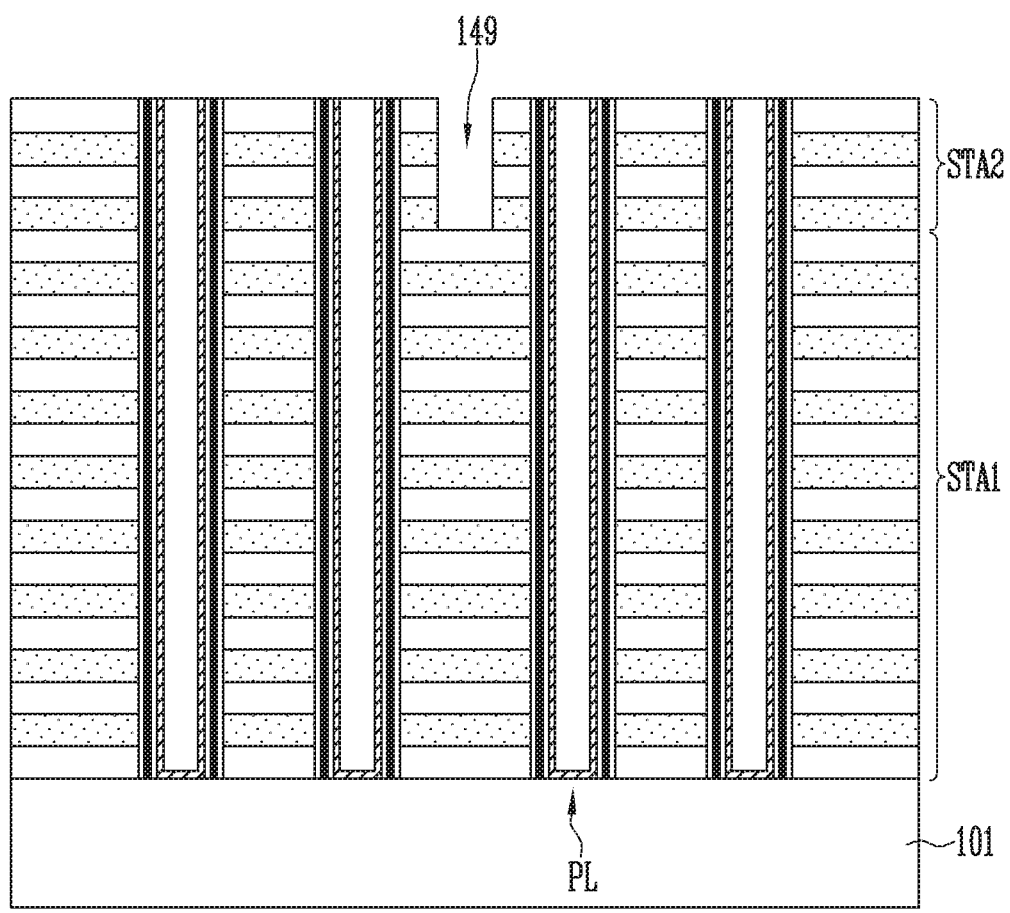

Referring to FIG. 9D, a first slit 149 is formed by etching the second stack structure STA exposed through the trench 147 shown in FIG. 9C through an etching process using the second mask pattern 141P shown in FIG. 9C as an etching barrier. The second mask pattern 141P may be removed after the first slit 149 is formed. The first slit 149 may be formed to have a depth where it does not penetrate the first stack structure STA.

The first slit 149 may be formed to be of a wave type to have a reversed shape with respect to the light irradiation region in the second photolithography process. That is, the shape of the first slit 149 corresponds to the transferred shape of the first gap g1 shown in FIG. 6A according to the second amount of light.

When each of the first stack structure STA1 and the second stack structure STA2 is formed in a structure in which interlayer insulating layers and sacrificial layers are alternately stacked as described in FIG. 5, a step of replacing the sacrificial layers with gate conductive patterns may be further performed.

Figure 10:
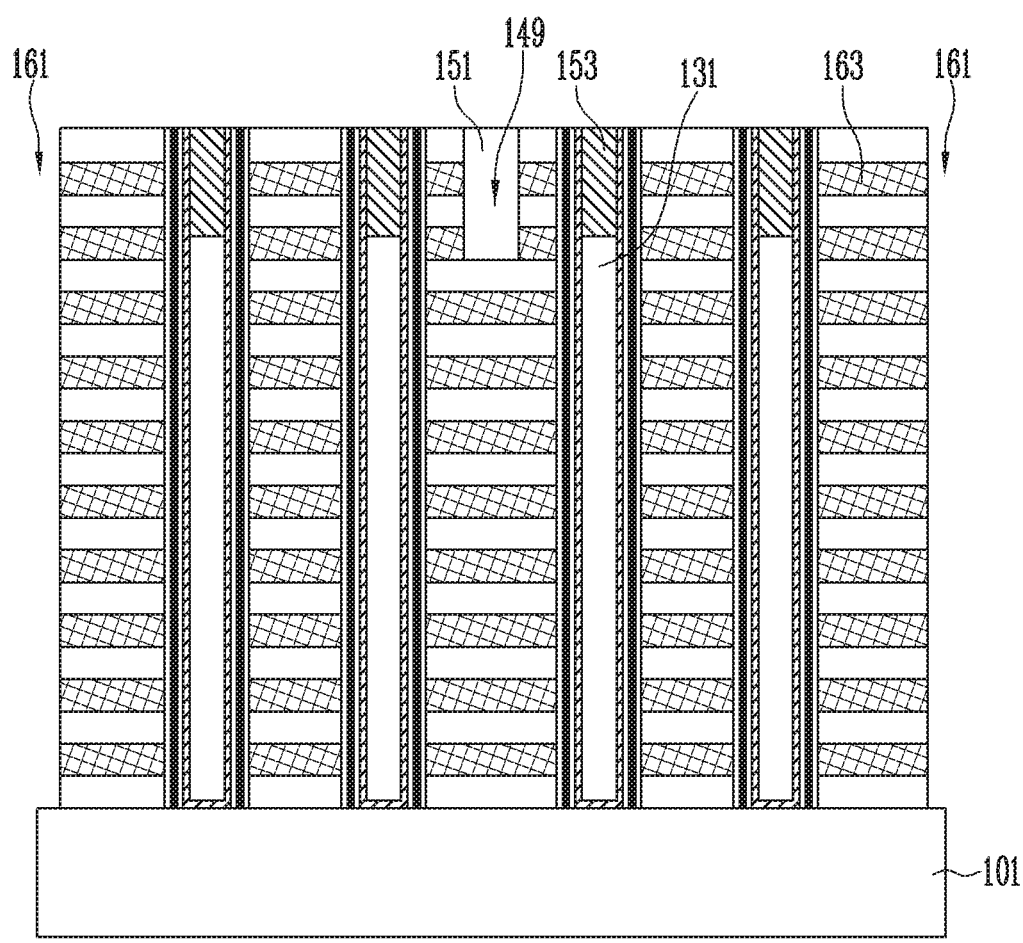

FIG. 10 illustrates an example of a process performed after the step ST7.

Referring to FIG. 10, after the step ST7, the first slit 149 may be filled with a slit insulating layer 151. A portion of the core insulating layer 131 may be recessed. In this case, the region in which the core insulating layer 131 is recessed may be filled with a capping conductive pattern 153.

Subsequently, second slits 161 may be formed. The second slits 161 may be formed to completely penetrate the first stack structure STA1 and the second stack structure STA2, which are shown in FIG. 9D. The second slits 161 are disposed with the first slit 149 interposed therebetween.

After that, the sacrificial layers of the first stack structure STA1 and the second stack structure STA2, which are shown in FIG. 9D, are replaced with gate conductive patterns 163 through the second slits 161. The step of forming the gate conductive patterns 163 may include a step of opening horizontal spaces between the interlayer insulating layers by removing the sacrificial layers of the first stack structure STA1 and the second stack structure STA2 through the second slits 161, a step of forming a gate conductive material through the second slits 161 such that the horizontal spaces are filled, and a step of dividing the gate conductive material into the gate conductive patterns 163 by removing the gate conductive material in the second slits 161.

The gate conductive material may be selected from various conductive materials such as a doped silicon layer, a metal layer, and a metal silicide layer. A barrier layer (not shown) may be further formed before the gate conductive material is formed. In this case, the gate conductive patterns 163 may be formed on the barrier layer. The barrier layer may prevent the interlayer insulating layer and the gate conductive patterns 163 from being in direct contact with each other. The barrier layer may include a titanium nitride layer, a tungsten nitride layer, a tantalum nitride layer, and the like.

In the step ST1 described in FIG. 5, each of the first stack structure STA1 and the second stack structure STA2 is not formed in a structure in which interlayer insulating layers and sacrificial layers are stacked but may be formed in a structure in which interlayer insulating layers and gate conductive layers are stacked. In this case, after the second slits 161 are formed, a process of replacing the sacrificial layers with the conductive patterns through the second slits 161 is omitted. Here, the gate conductive layers of each of the first stack structure STA1 and the second stack structure STA2 may be used as gate conductive patterns isolated by the second slits 161.

Also, in the step ST1 described in FIG. 5, each of the first stack structure STA1 and the second stack structure STA2 is not formed in a structure in which interlayer insulating layers and sacrificial layers are stacked but may be formed in a structure in which sacrificial conductive layers and gate conductive layers are stacked. In this case, after the second slits 161 are formed, the process of forming the gate conductive patterns through the second slits 161 may be omitted. Here, a process of replacing sacrificial layers with interlayer insulating layers through the second slits 161 may be performed. Each of the gate conductive layers may be divided into the gate conductive patterns by the second slits 161.

In the embodiment of the present disclosure, the first amount of light in the first photolithography process is controlled to be different from the second amount of light in the second photolithography process, so that the light transmission holes of the exposure mask can be transferred to have the shapes of the channel holes or be transferred to have the shape of the wave-type first slit. As described above, one exposure mask is used to define patterns having different shapes by controlling the amount of light, so that the manufacturing cost of the semiconductor device may be reduced.

Meanwhile, according to the embodiment of the present disclosure, the first slit may be formed to be of a wave type by the layout of the light transmission holes. According to the embodiment of the present disclosure, since the wave-type slit is defined by the shapes of the light transmission holes of the exposure mask for patterning the channel holes, the wave-type slit may have a shape matched to the appearance of the channel holes. The wave-type slit occupies a narrower area between the channel holes, as compared with a straight-type slit. Accordingly, in the embodiment of the present disclosure, it is possible to reduce the area of a horizontal space occupied by the slit.

Figure 11:
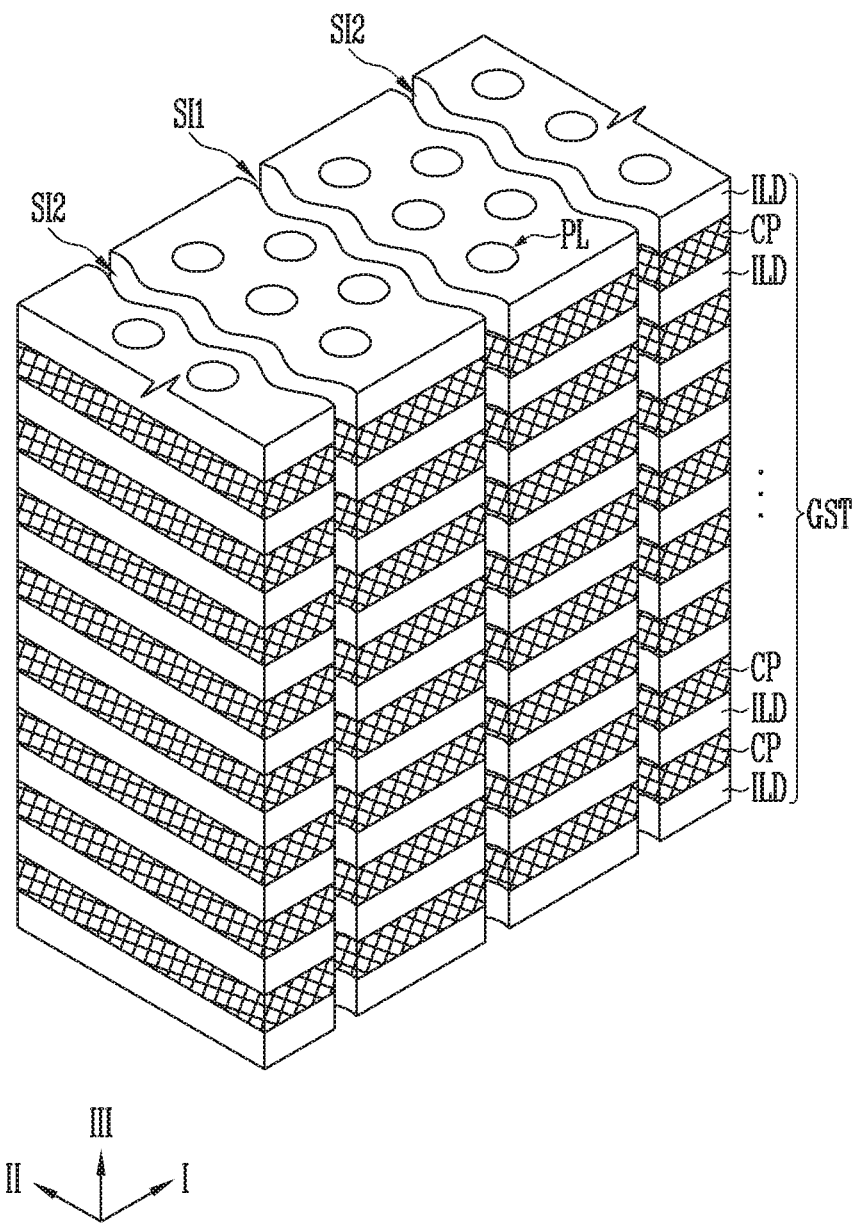
FIG. 11 is a perspective view illustrating a gate stack structure of a three-dimensional semiconductor device in accordance with an embodiment of the present disclosure.

FIG. 11 is a perspective view illustrating a gate stack structure of a three-dimensional semiconductor device according to another embodiment of the present disclosure.

Referring to FIG. 11, each of gate stack structures GST, as described in FIG. 1, may include interlayer insulating layers ILD and conductive patterns CP, which are alternately stacked, and be penetrated by cell plugs PL.

The gate stack structures GST may be isolated from each other by a first slit SI1 and second slits SI2, which are alternately disposed in a first direction I. Like the second slits SI2, the first slit SI1 may be formed to have a depth where it completely penetrates the interlayer insulating layers ILD and the conductive patterns CP. Like the first slit SI1, the second slit SI2 may be formed to be of a wave type. Each of the first slit SI1 and the second slits SI2 may extend along a second direction II intersecting the first direction I.

The semiconductor device shown in FIG. 11 may be formed using the manufacturing method described in FIG. 4. The first slit SI1 and the second slits SI2 of the semiconductor device shown in FIG. 11 may be simultaneously formed, and be formed using an exposure mask for forming channel holes. At this time, a layout of the exposure mask is different from that of the exposure mask shown in FIG. 6A.

Figure 12A:
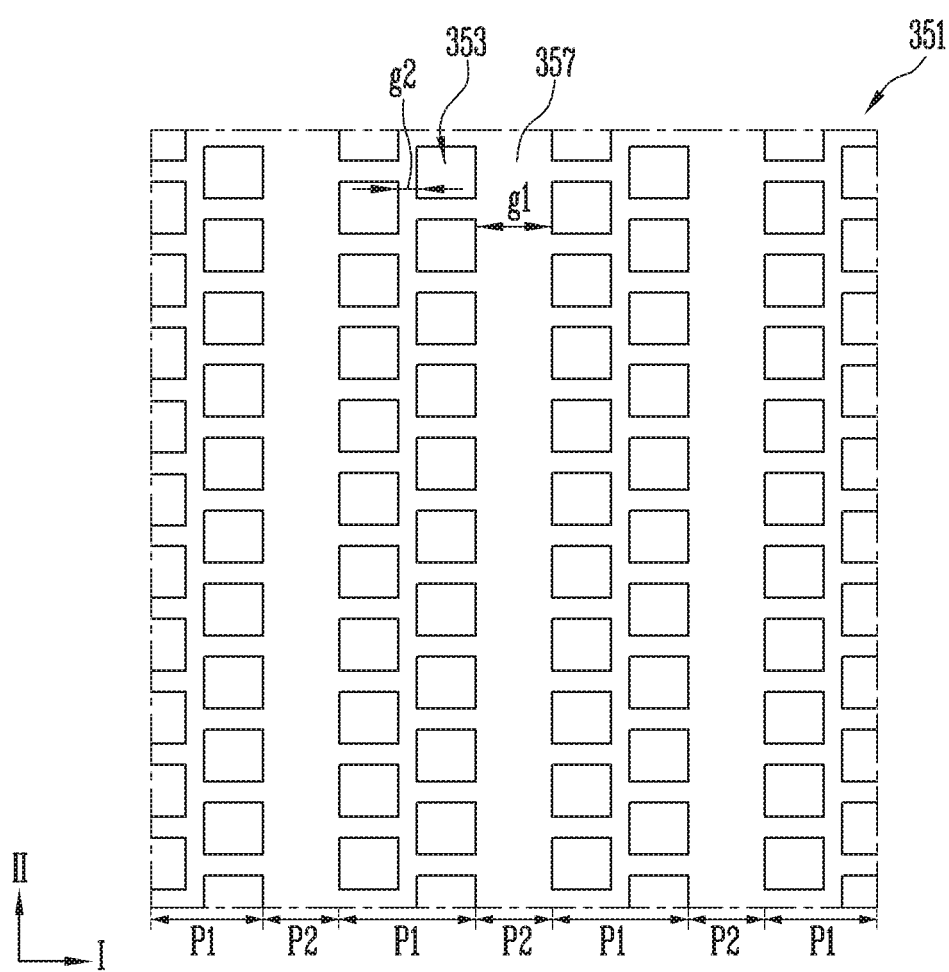
FIG. 12A is a plan view illustrating a layout of an exposure mask for forming the semiconductor device shown in FIG. 11.

FIG. 12A is a plan view illustrating a layout of an exposure mask for forming the semiconductor device shown in FIG. 11.

Referring to FIG. 12A, the exposure mask 351 may include light transmission holes 353 and a light blocking pattern 357. The light transmission holes 353 may be arranged to be spaced apart from each other at a first gap g1 or a second gap g2 along the first direction I. The first gap g1 may be larger than the second gap g2. The light transmission holes 353 may be arranged in zigzag so as to increase the arrangement density of channel holes.

The exposure mask 351 may include first and second regions P1 and P2 alternately disposed in the first direction I. The first regions P1 are regions in which the light transmission holes 353 are spaced apart from each other at the second gap g2. Each of the second regions P2 is a region that is defined between adjacent first regions P1 and blocks light in a photolithography process. A pair of light transmission holes adjacent to each other in the first direction I with the second region P2 interposed therebetween are disposed to be spaced apart from each other at the first gap g1.

Each of the light transmission holes 353 is surrounded by the light blocking pattern 357. The light blocking pattern 357 completely blocks the second regions P2, and is formed between the light transmission holes 353 of the first regions P1 to have a width corresponding to the second gap g2.

The light transmission holes 353 disposed in the first regions P1 and portions of the light blocking pattern 357, which are disposed in the first regions P1, may be transferred in different shapes in a photoresist layer according to the amount of light irradiated in an exposure process.

For example, after the first photoresist layer 113 is formed as shown in FIG. 5, a first photolithography process using the exposure mask 351 shown in FIG. 12A may be performed. The first photolithography process may include a step of forming first exposure regions and first non-exposure regions in the first photoresist layer 113 by performing the exposure process using the exposure mask 351. The exposure process of the first photolithography process may be performed with a first amount of light according to a normal dose energy. According to the first photolithography process, the shapes of the light transmission holes 353 are transferred as the first exposure regions to the inside of the first photoresist layer 113. Subsequently, channel holes may be formed by performing the same processes as described in FIGS. 7A and 7D, and cell plugs may be formed in the channel holes by performing the same processes as described in FIG. 7E.

Meanwhile, after a second photoresist layer is formed on the stack structure, a second photolithography process using the exposure mask shown in FIG. 12A may be performed. The second photoresist layer may be a negative photoresist layer.

Figure 12B:
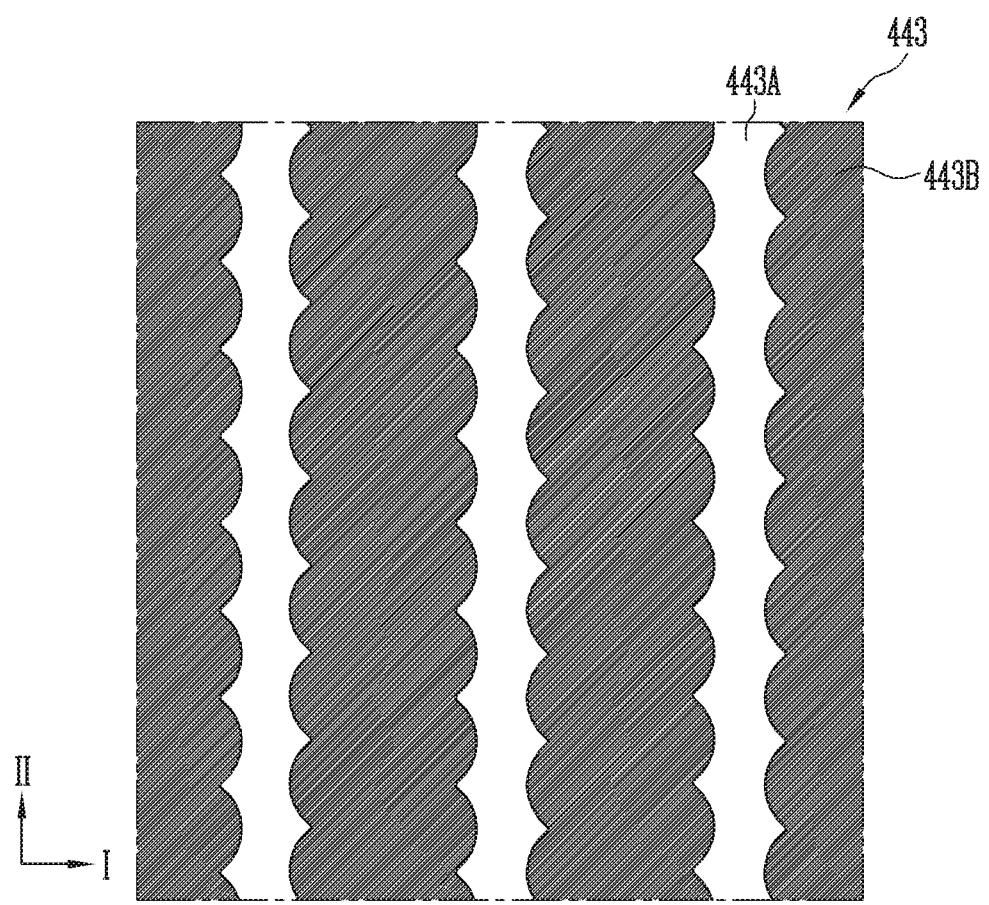
FIG. 12B is a plan view illustrating a layout of second exposure regions and second non-exposure regions of a second photoresist layer according to a second photolithography process using the exposure mask shown in FIG. 12A.

FIG. 12B is a plan view illustrating a layout of second exposure regions and second non-exposure regions of a second photoresist layer according to a second photolithography process using the exposure mask shown in FIG. 12A.

Referring to FIG. 12B, the second photolithography process may include a step of forming second exposure regions 443B and second non-exposure regions 443A in a second photoresist layer 443 by performing an exposure process using the exposure mask 351 shown in FIG. 12A. The exposure process of the second photolithography process may be performed by irradiating light having a second amount according to over-dose energy.

The second amount of light is greater than the first amount of light in the first photolithography process. According to the second amount of light irradiated in the exposure process of the second photolithography process, the second gaps g2 between the light transmission holes 353 shown in FIG. 12A are not transferred to the inside of the second photoresist layer 443. According to the second amount of light irradiated in the exposure process of the second photolithography process, the light transmission holes 353 shown in FIG. 12A may be transferred in a shape enlarged in the second photoresist layer 443. Thus, light transmitted through the light transmission holes 353 of the exposure mask 351 shown in FIG. 12A forms the second exposure regions 443B having a shape different from that of the first exposure regions in the second photoresist layer 443.

According to the second amount of light, the first gap g1 larger than each of the second gaps g2 of the exposure mask 351 shown in FIG. 12A may be transferred to the inside of the second photoresist layer 443. Each of the second non-exposure regions 443A of the second photoresist layer 443 corresponds to the transferred shape of the first gap g1. The transferred shape of the first gap g1 has a reversed shape with respect to the light radiation region.

According to the layout of the first and second regions P1 and P2 described in FIG. 12A, the second exposure regions 443B and the second non-exposure regions 443A may be alternately disposed in the first direction I.

After the second exposure regions 443B and the second non-exposure regions 443A are formed, the second non-exposure regions 443A are removed, and the second exposure regions 443B remain as a second photoresist pattern. After that first and second silts that completely penetrate the stack structures and have a wave type may be formed through an etching process using, as an etching barrier, the second exposure regions 443B that remain as the second photoresist pattern.

Subsequently, a subsequent process of forming gate patterns, using the first and second slits, may be performed.

Figure 13:
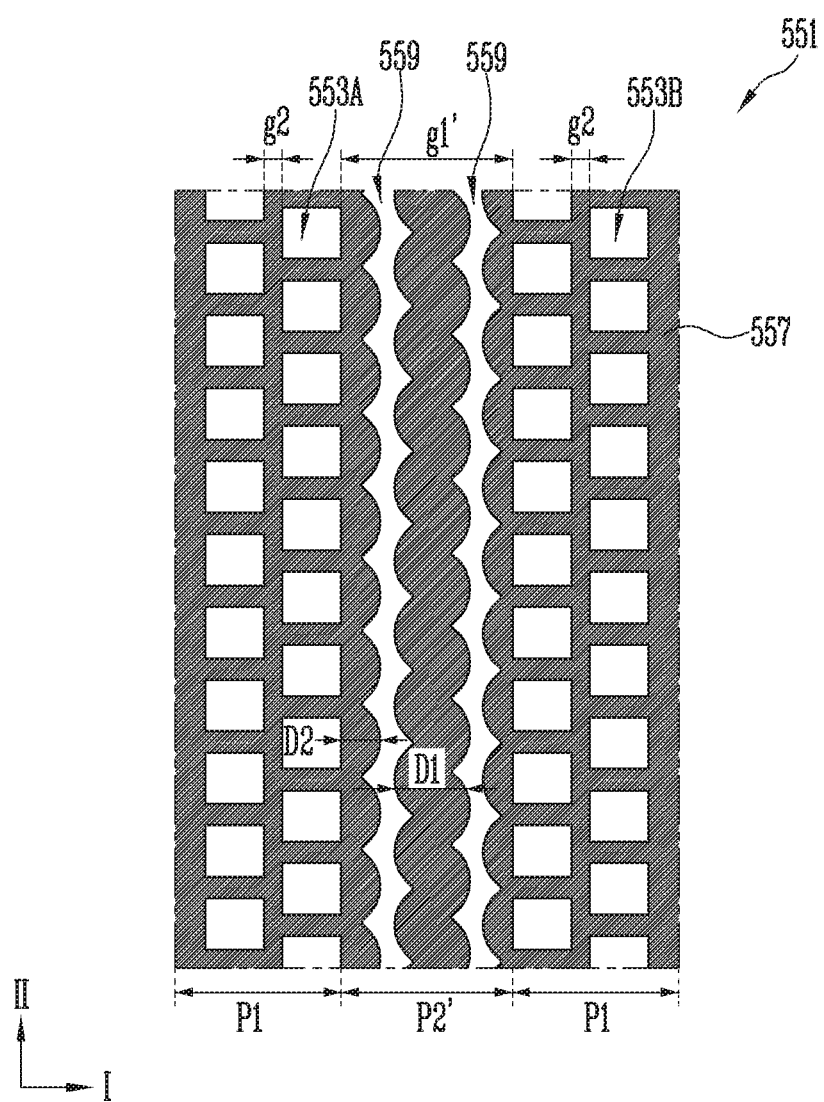
FIG. 13 is a plan view illustrating a layout of an exposure mask in accordance with an embodiment of the present disclosure.

FIG. 13 is a plan view illustrating a layout of an exposure mask according to another embodiment of the present disclosure.

Referring to FIG. 13, the exposure mask 551 may include first regions P1 and a second region P2'. In the exposure mask 551, light transmission holes 553A and 553B may be arranged in the first regions P1. The light transmission holes 553A and 553B may be arranged in zigzag so as to increase the arrangement density of channel holes. In the exposure mask 551, transparent assist features 559 may be arranged in the second region P2'. The exposure mask 551 may include a light blocking pattern 557 disposed around the light transmission holes 553A and 553B and the transparent assist features 559. Hereinafter, for convenience of description, the light transmission holes 553A disposed at one side of the second region P2' are defined as first light transmission holes, and the transmission holes 553B disposed at the other side of the second region P2' are defined as second light transmission holes.

The first light transmission holes 553A included in a column adjacent to the second region P2' and the second light transmission holes 553B included in a column adjacent to the second region P2' may be spaced apart from each other at a first gap g1'. The first light transmission holes 553A or the second light transmission holes 553B may be spaced apart from each other at a second gap g2 in each of the first regions P1. The first gap g1' is larger than the second gap g2. The first gap g1' may be widely defined to include a space in which the transparent assist features 559 are disposed. The transparent assist features 559 may be spaced apart from each other at a first distance D1. The transparent assist features 559 may be spaced apart from the light transmission holes 553A and 553B adjacent to the second region P2' at a second distance D2. The first distance D1 is larger than the second distance D2. A wave-type slit may be defined by the shape of the light blocking pattern 557 that defines the first distance D1.

The second region P2' shown in FIG. 13 may be applied to the second region P2 shown in FIG. 6A. Alternatively, the second region P2' shown in FIG. 13 may be applied to each of the second regions P2 shown in FIG. 12A.

The first photolithography process described in FIG. 5 may be performed using the exposure mask 551 shown in FIG. 13. Accordingly, the shapes of the light transmission holes 553A and 553B are transferred as exposure regions to the inside of the photoresist layer. After that, channel holes may be formed by performing the same processes as described in FIGS. 7A to 7D, and cell plugs may be formed in the channel holes by performing the same processes as described in FIG. 7E.

Subsequently, a second photolithography process using the exposure mask shown in FIG. 13 may be performed. The second photolithography process includes an exposure process performed with the second amount of light that is larger than the first amount of light in the first photolithography process.

The first amount of light irradiated in the first photolithography process is controlled such that the shapes of the transparent assist features 559 are not transferred to the inside of the photoresist layer. Meanwhile, the second amount of light irradiated in the second photolithography process is controlled such that the light transmission holes 553A and 553B and the transparent assist features 559 are transferred in shapes extending in the photoresist layer to define exposure regions. The second amount of light is controlled such that the shape of the light blocking pattern 557 that defines the second gaps g2 smaller than the first distance D1 and the second distance D2 smaller than the first distance D1 is not transferred to the inside of the photoresist layer. In this case, the shape of the light blocking pattern 557 that defines the first distance D1 by controlling the amount of light may be transferred to the inside of the photoresist layer.

After that, the processes described in FIGS. 9B to 9D and 10 may be sequentially performed.

The exposure mask 551 shown in FIG. 13 includes the transparent assist features 559 for defining a wave-type slit. The transparent assist features 559 may be used as patterns that ensure a depth of focus (DOF) margin and improve aberration when the first photolithography process is performed. When the wave-type slit is formed using the transparent assist features 559, it is possible to easily control the width of a conductive pattern that is adjacent to the wave-type slit and surrounds the cell plugs.

According to the above-described embodiments of the present disclosure, the wave-type slit is patterns using the exposure mask including the light transmission holes, so that it is possible to decrease the number of exposure masks employed for forming the three-dimensional semiconductor device. Accordingly, the manufacturing cost of the three-dimensional semiconductor device may be substantially reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
    forming a stack structure;
    forming a photoresist layer on the stack structure;
    exposing the photoresist layer with an amount of light controlled such that a first gap is transferred and second gaps are not transferred, using an exposure mask, wherein the exposure mask includes first light transmission holes, second light transmission holes, and a light blocking pattern, and is formed such that the light blocking pattern blocks the first gap between the first and second light transmission holes adjacent to each other and the second gaps between the first light transmission holes and between the second light transmission holes;
    forming a photoresist pattern by removing a non-exposure region of the photoresist layer, which corresponds to a transferred shape of the first gap; and
    forming a wave-type slit corresponding to the transferred shape in the stack structure, using the photoresist pattern.

2. The method of claim 1, wherein the first gap is larger than each of the second gaps.

3. A method of manufacturing a semiconductor device, the method comprising:
    forming a stack structure;
    forming channel holes corresponding to light transmission holes in the stack structure by performing a first photolithography process using an exposure mask that includes the light transmission holes;
    forming a cell plug including a channel layer in each of the channel holes; and
    forming a first wave-type slit in the stack structure by performing a second photolithography process using the exposure mask, wherein the first wave-type slit has a reversed shape with respect to a light irradiation region defined by allowing light to be transmitted through the light transmission holes.

4. The method of claim 3, wherein the first photolithography process includes:
    forming a first mask layer on the stack structure;
    forming a first photoresist layer on the first mask layer;
    forming exposure regions spaced apart from each other in the first photoresist layer by exposing the first photoresist layer through the light transmission holes of the exposure mask;
    forming a first photoresist pattern by removing the exposure regions;
    forming a first mask pattern having opening holes by etching the first mask layer through an etching process using the first photoresist pattern as an etching barrier; and
    forming the channel holes by etching the stack structure exposed through the opening holes through an etching process using the first mask pattern as an etching barrier.

5. The method of claim 3, wherein the second photolithography process includes:
    forming a second mask layer on the stack structure;
    forming a second photoresist layer on the second mask layer;
    forming an exposure region and a non-exposure region in the second photoresist layer, by exposing the second photoresist layer through the light transmission holes, the exposure region corresponding to the light irradiation region and the non-exposure region corresponding to the reversed shape with respect to the light irradiation region;
    forming a second photoresist pattern by removing the non-exposure region;
    forming a second mask pattern having a trench corresponding to the non-exposure region by etching the second mask layer through an etching process using the second photoresist pattern as an etching barrier; and
    forming the first wave-type slit by etching the stack structure exposed through the trench through an etching process using the second mask pattern as an etching barrier.

6. The method of claim 5, wherein the light transmission holes include first light transmission holes and second light transmission holes spaced apart from the first light transmission holes with a first gap interposed therebetween,
    wherein a gap between the first light transmission holes and a gap between the second light transmission holes are formed smaller than the first gap not to be transferred to the exposure region.

7. The method of claim 3, wherein an amount of light irradiated in the second photolithography process is controlled greater than that of light irradiated in the first photolithography process such that some of the light transmission holes are transferred in a shape in which they are connected to each other.

8. The method of claim 3, wherein the first slit penetrates a portion of the stack structure or completely penetrates the stack structure.

9. The method of claim 3, further comprising forming second slits that completely penetrate the stack structure,
wherein the first slit is formed shorter than the second slits between the second slits.

10. The method of claim 3, wherein the exposure mask includes:
first regions providing a space in which the light transmission holes are disposed;
a second region defined between the first regions, the second region being completely blocked by a light blocking pattern having a width larger than that of a gap between the light transmission holes disposed in the first regions; and
a third region disposed opposite to the second region with any one of the first regions, which is interposed therebetween, the third region including transparent assist features.

11. The method of claim 10, wherein the third region is used as a light blocking region in the first photolithography process, and is used as a light transmission region in the second photolithography process.

12. The method of claim 3, wherein the exposure mask includes first regions and a second region between the first regions,
wherein transparent assist features that are disposed to be spaced apart from each other at a first distance and have a wave type are formed in the second region, and
light transmission holes are disposed in each of the first regions,
wherein a light blocking pattern is formed around each of the light transmission holes and the transparent assist features.

13. The method of claim 12, wherein the transparent assist features are spaced apart from the light transmission holes adjacent to the second region at a second distance smaller than the first distance, and
the light transmission holes are spaced apart from each other at a gap smaller than the first distance in each of the first regions.

14. A method of manufacturing a three-dimensional semiconductor device, the method comprising:
forming a stack structure;
patterning channel holes using light transmission holes of an exposure mask;
forming cell plugs penetrating the stack structure; and
patterning wave-type slits using light transmission holes of the exposure mask.

15. The method of claim 14, wherein the step of patterning channel holes further includes sequentially stacking a first mask layer and a first photoresist layer on the stack structure, and exposing the first photoresist layer by light transmitted through the exposure mask.

16. The method of claim 15, wherein the exposure mask includes the light transmission holes, transparent assist features, and a light blocking pattern, and
wherein the light transmission holes are spaced apart from each other at a first gap or a second gap, the first gap being larger than the second gap; and
wherein the light transmission holes are arranged in a zigzag.

17. The method of claim 16, further comprising a first photolithography process for transferring the shapes of the light transmission holes to the first photoresist layer,
wherein the light transmitted through the light transmission holes of the exposure mask by the exposure process of the first photolithography process forms first exposure regions in the first photoresist layer which correspond to the shapes of the light transmission holes.

18. The method of claim 17, further comprising dissolving the first exposure regions using a developer leaving a first non-exposure region as a first photoresist pattern.

19. The method of claim 16, wherein the patterning of the wave-type slits includes a second photolithography process in which a second photoresist layer is exposed by light transmitted through the exposure mask.

20. The method of claim 19, wherein the second photolithography process includes:
forming a second mask layer on the stack structure;
forming the second photoresist layer on the second mask layer;
forming an exposure region and a non-exposure region in the second photoresist layer, by exposing the second photoresist layer through the light transmission holes, the exposure region corresponding to a light irradiation region and the non-exposure region corresponding to the reversed shape with respect to the light irradiation region;
forming a second photoresist pattern by removing the non-exposure region;
forming a second mask pattern having a trench corresponding to the non-exposure region by etching the second mask layer through an etching process using the second photoresist pattern as an etching barrier; and
forming a first slit by etching the stack structure exposed through the trench through an etching process using the second mask pattern as an etching barrier.

* * * * *